United States Patent [19]

Kasuga

[11] Patent Number: 5,656,402

[45] Date of Patent: Aug. 12, 1997

[54] METHOD FOR ALIGNMENT OF MANUFACTURING SEMICONDUCTOR APPARATUS

[75] Inventor: Takashi Kasuga, Kanagawa, Japan

[73] Assignee: Sony Corporation, Japan

[21] Appl. No.: 517,220

[22] Filed: Aug. 21, 1995

[30] Foreign Application Priority Data

Aug. 22, 1994 [JP] Japan .................................. 6-219463

[51] Int. Cl.$^6$ .................................................. G03F 9/00
[52] U.S. Cl. ................................................ 430/22; 356/399
[58] Field of Search ........................ 430/22, 5; 356/399, 356/400, 401

[56] References Cited

U.S. PATENT DOCUMENTS 5,444,538  8/1995  Pellegrini ................................. 430/22
5,468,580  11/1995  Tanaka ................................... 430/22

*Primary Examiner*—S. Rosasco
*Attorney, Agent, or Firm*—Ronald P. Kananen

[57] ABSTRACT

This invention provides an alignment method in which alignment correction coefficients are calculated by a method of least squares in reference to the coordinates of each of the alignment marks and the coordinates of the rational grid points, corrected coordinates of the alignment marks from the coordinates of the rational grid points on the basis of the alignment mark correction coefficients and each of their statistical functions are calculated, the differences of these coordinates are calculated, the residuals at each of the alignment marks are calculated in reference to a difference between the alignment displacement tolerance values in the predetermined directions X and Y and their coordinates, and the corrected coordinates of the alignment marks associated with the first pattern for optically exposing the second pattern from the alignment mark correction coefficients and their random number elements when the residual sum of squares becomes a minimum value, thereby the most optimal correction of the alignment can be carried out even in the case that the random elements in the alignment mark displacement components from the rational grid point do not follow a normal distribution.

17 Claims, 24 Drawing Sheets

(OFFSET)

(ROTATION)

(ORTHOGONAL DEGREE OF LAYOUT)

(SCALING)

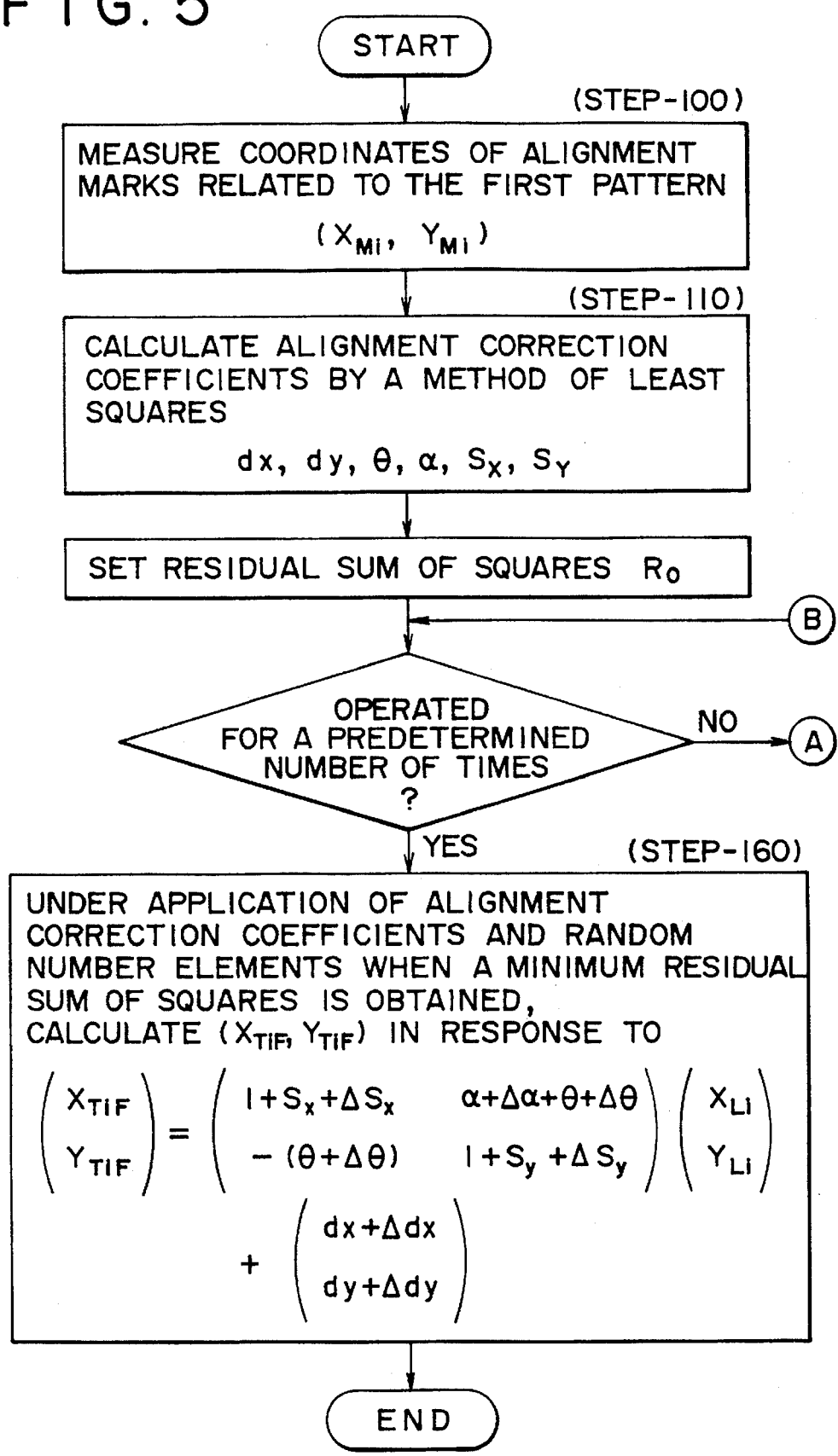

$|\Delta X_{11}| \leq tol_X$ $|\Delta Y_{11}| \leq tol_Y$ $\Delta E_{X11} = 0$ $\Delta E_{Y11} = 0$ $|\Delta X_{i1}| > tol_X$ $|\Delta Y_{i1}| > tol_Y$ $\Delta E_{Xi1} = |\Delta X_{i1}| - tol_X$ $\Delta E_{Yi1} = |\Delta Y_{i1}| - tol_Y$ $|\Delta X_{i1}| > tol_X$ $|\Delta Y_{i1}| \leq tol_Y$ $\Delta E_{Xi1} = |\Delta X_{i1}| - tol_X$ $\Delta E_{Yi1} = 0$ $|\Delta X_{11}| \leq tol_X$ $|\Delta Y_{11}| > tol_Y$ $\Delta E_{X11} = 0$ $\Delta E_{Y11} = |\Delta Y_{11}| - tol_Y$

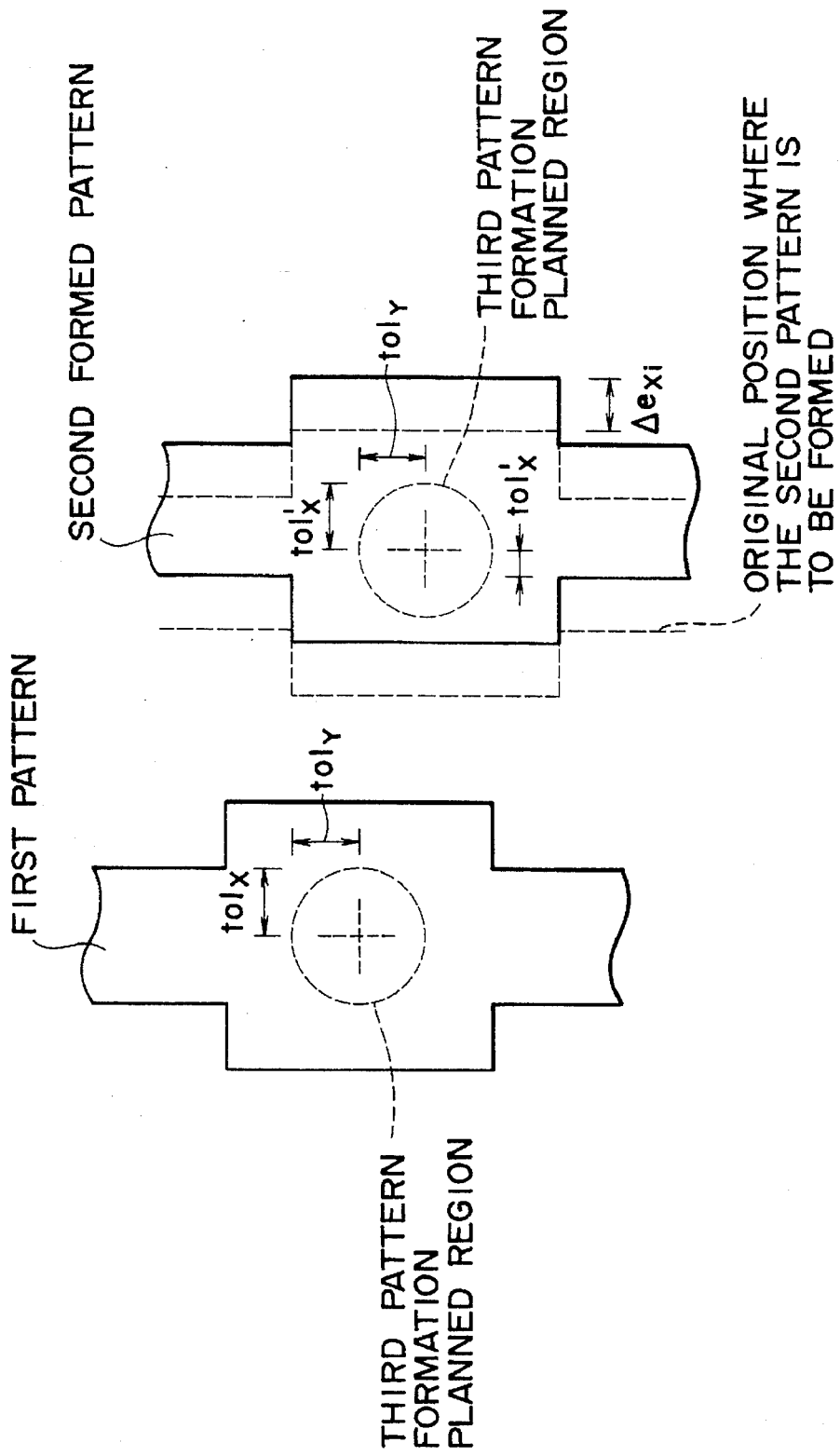

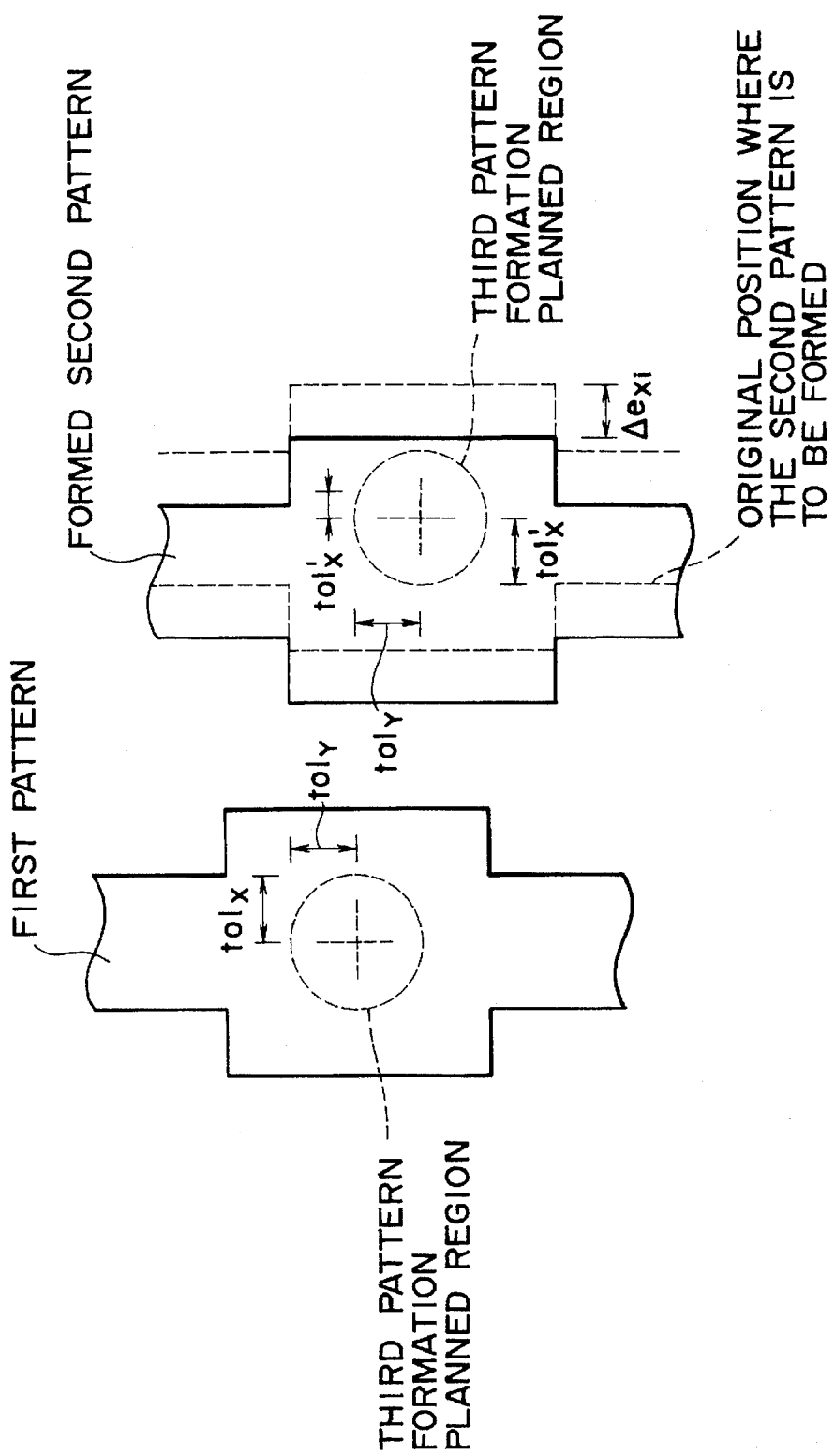
FIG. 20 IN THE CASE OF Δex < 0

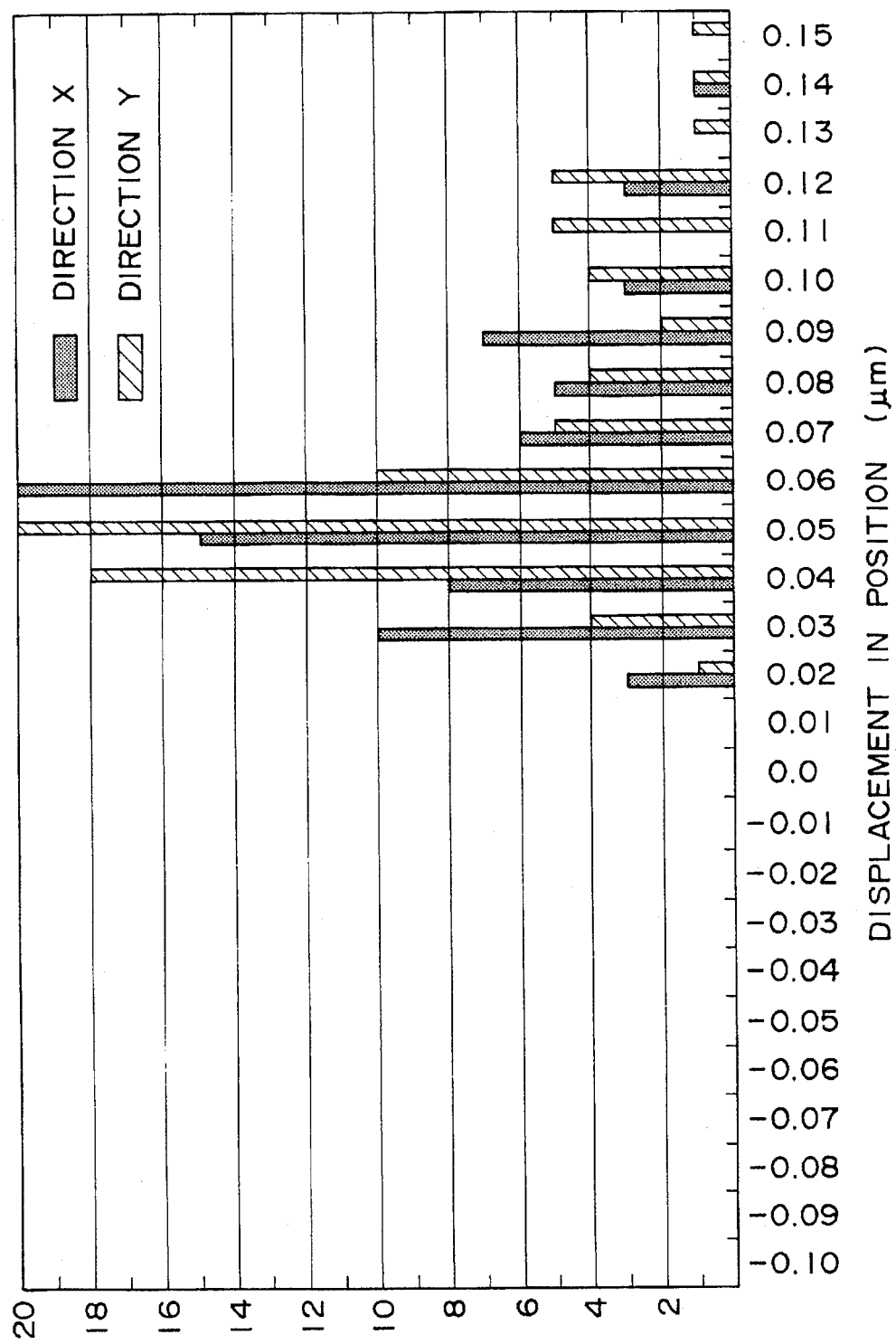

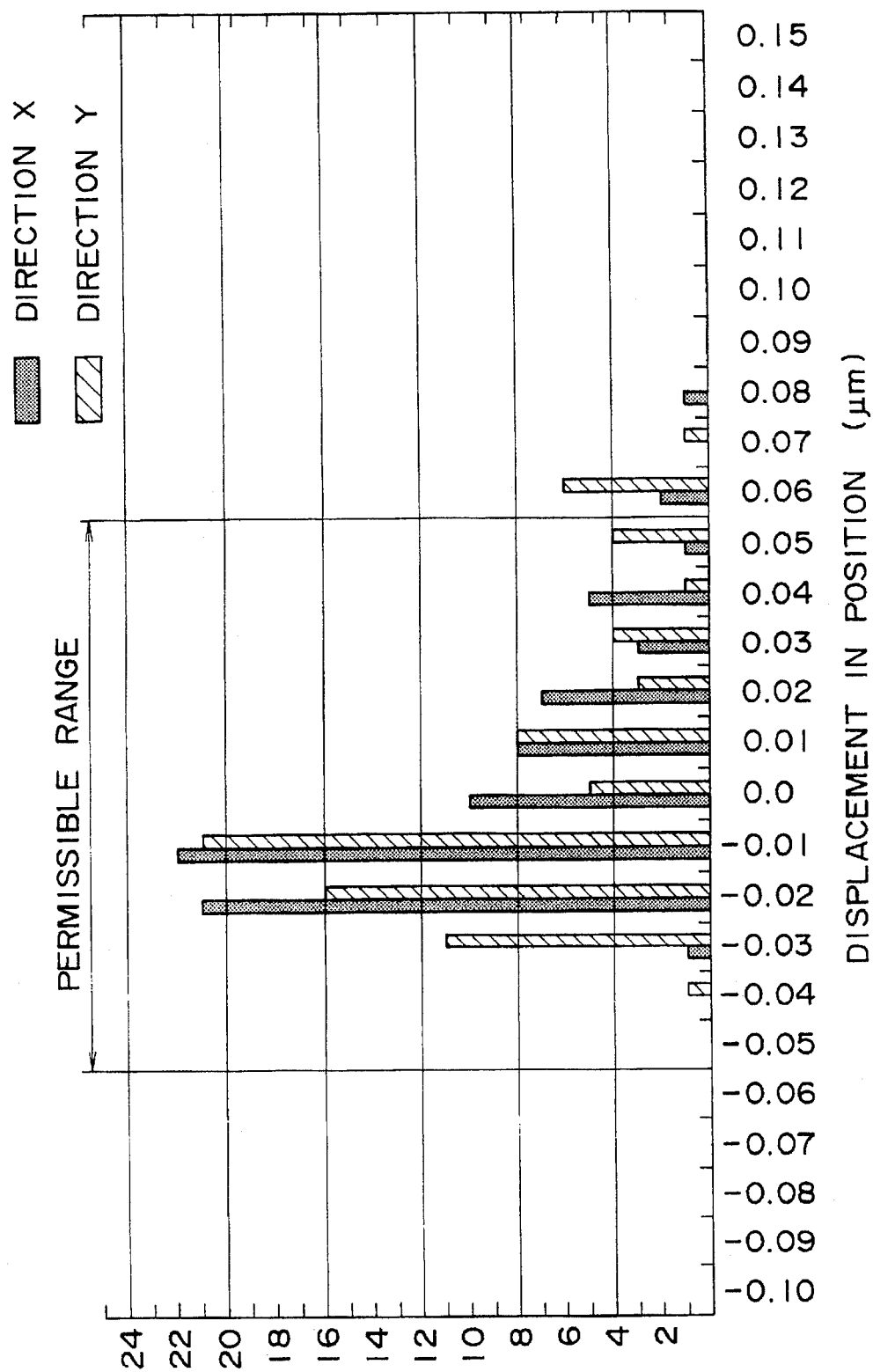

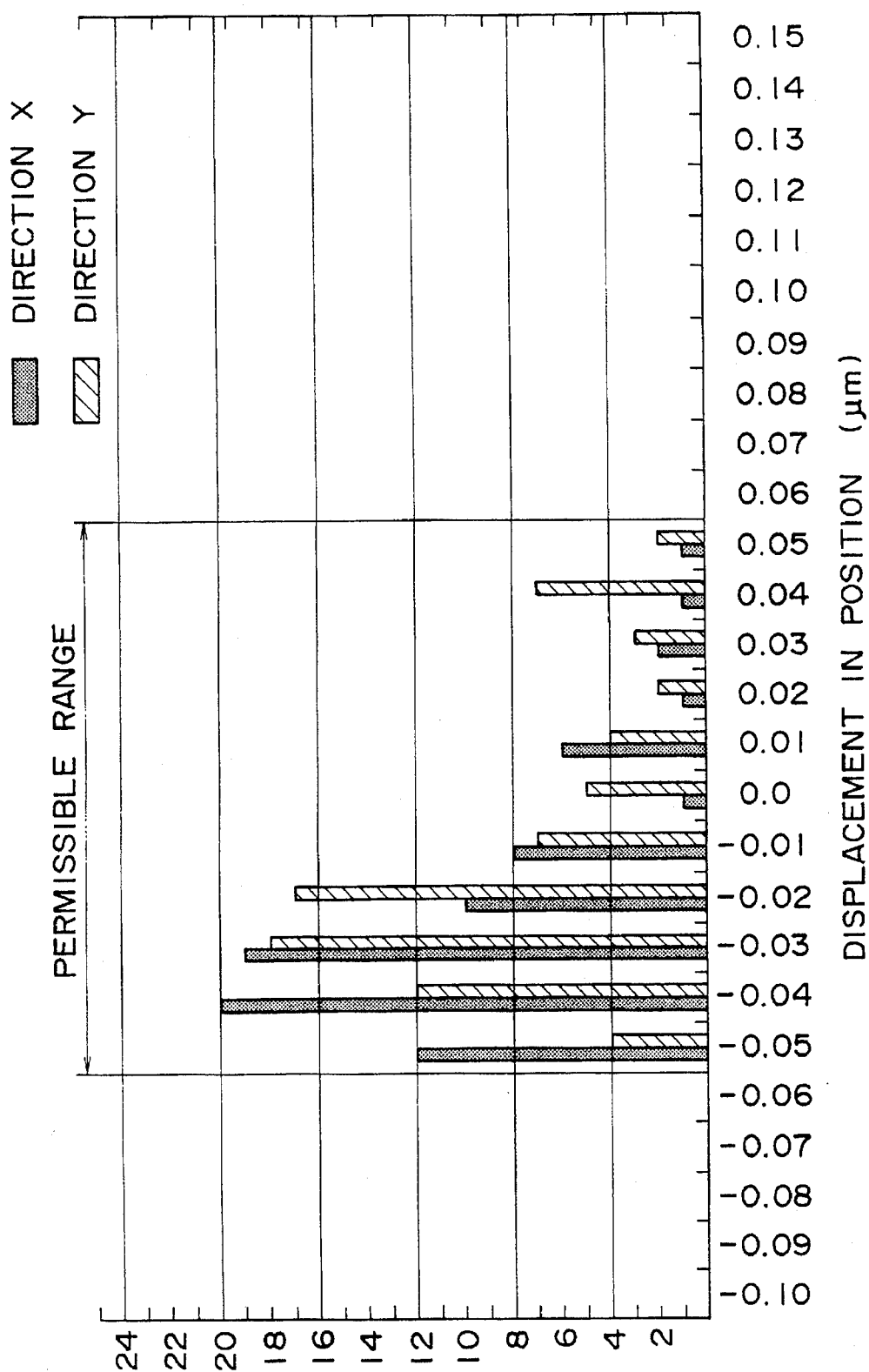

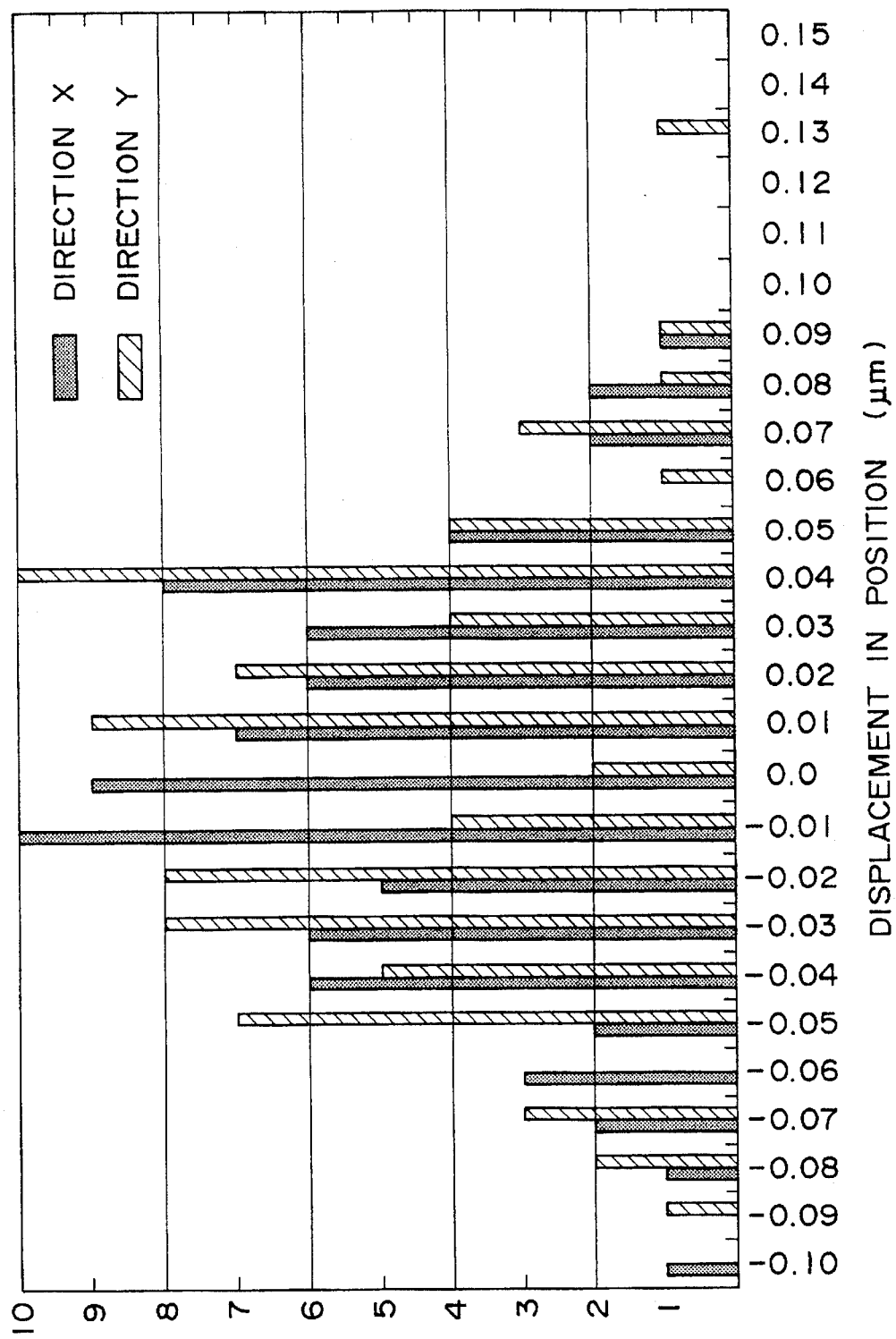

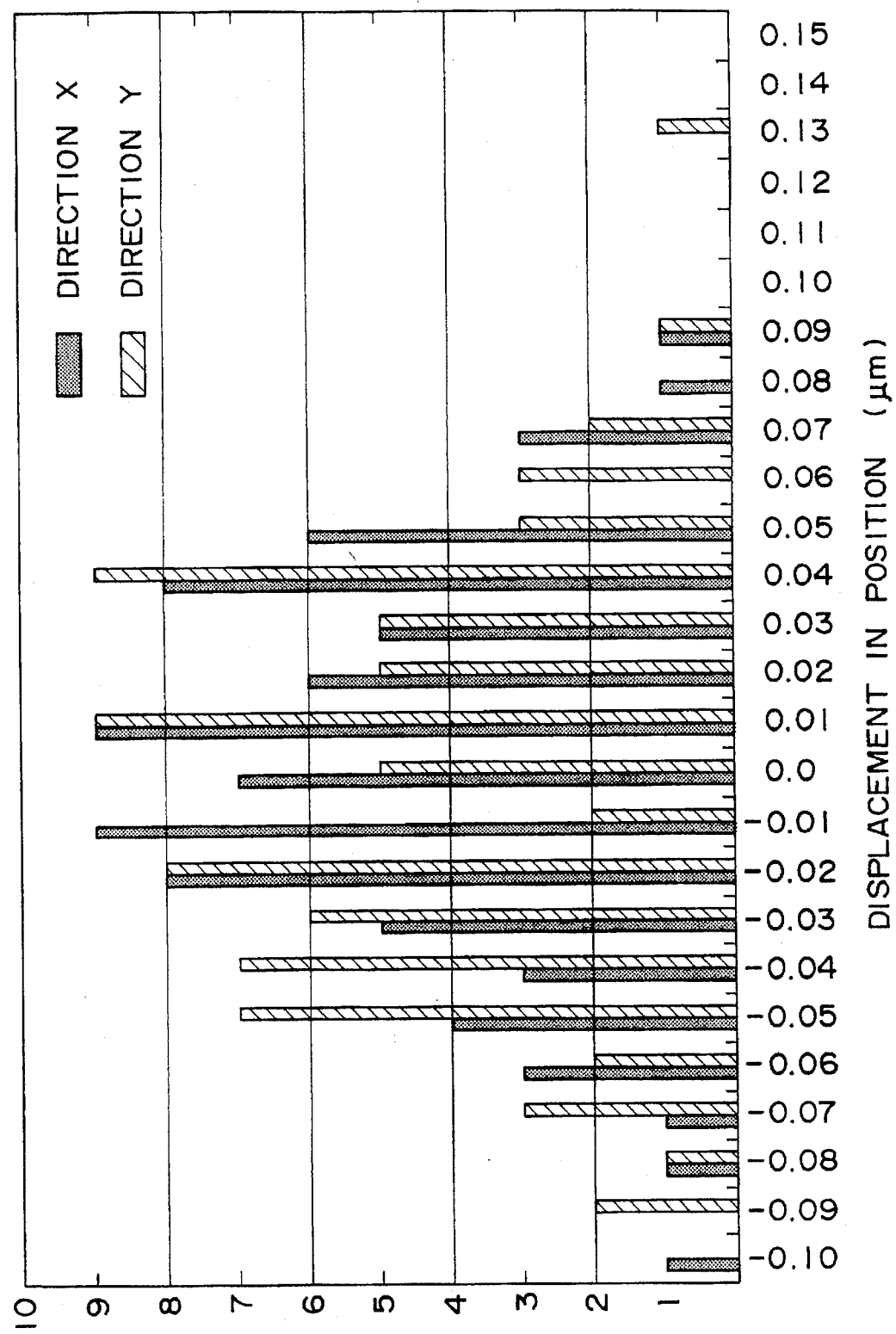

METHOD FOR ALIGNMENT OF MANUFACTURING SEMICONDUCTOR APPARATUS

BACKGROUND OF THE INVENTION

1. Field of the Invention

This invention relates to an alignment method in an optical exposing process for a semiconductor device, and more particularly a new advanced global alignment method.

2. Description of Related Art

In the trend of increasingly high integration of VLSI and large-sized chips in recent years, the requirement for position alignment accuracy in a stepping device has become more and more severe. As for LSI such as 64M DRAM or 16M SRAM being developed at present time with a class of design rule of 0.35 µm, in the case that a mean value of positional displacement in alignment is defined as $X_{ave}$ and a standard deviation is defined as $\sigma$, a high accuracy in position alignment having 0.1 µm or less as a target value of $|X_{ave}|+3\sigma$ is required for an entire surface of the wafer. In this case, an appendix letter of "ave" means a mean value.

The optical exposing operation for the LSI chip in the related art stepping device is carried out in a way of chasing a grid pattern under a stepping operation of a wafer stage. Then, in order to form a second pattern on a first pattern already formed on the wafer, a resist is formed on the first pattern, thereafter the resist is exposed under an application of reticle having the second pattern formed thereon. During this optical exposing operation, the positions of the wafer alignment marks (hereinafter merely called as alignment marks) associated with the first pattern for each of the optical exposing shots already formed on the wafer are measured by an alignment sensing system. Accordingly, an improvement of high precision alignment capability is required for hardware of the stepping device and in turn in order to make the most preferable alignment at each of the optical exposing shots, it is also necessary to improve alignment operation such as a statistical correction against the alignment.

As one kind of alignment correction in the related art stepping device, there is an advanced global alignment process (hereinafter called alignment method). This alignment method is an alignment system in which a wafer stage of the stepping device is moved to an exposing position in response to a statistical estimating calculation in reference to positional information of a plurality of alignment marks. A summary of a principle of this advanced global alignment method will be described as follows.

In the case that a second pattern is formed on the first pattern already formed, prior to this formation, the positions of the alignment marks associated with the first pattern for each of the optical exposing shots already formed on the wafer are measured by the alignment sensing system in reference to the wafer stage. Then, as shown in FIG. 1 and described in detail as follows, an optical exposing shot layout is converted in such a manner that a positional displacement between the positions of the rational grid points (hereinafter sometimes merely called as rational grid points) corresponding to each of the alignment marks and the measured position of each of the alignment marks may become minimum, thereafter alignment operation is performed to make an optical exposure of the resist. In FIG. 1, rational grid points are connected by solid lines, measured positions of each of the alignment marks are connected by dotted lines and the points after conversion of the optical exposing shot layouts (rational grid points) are connected by alternate long and short dash lines.

At present, a certain one rational grid point will be studied. The measured coordinates of the alignment mark corresponding to this rational grid point is defined as $a_M$ ($X_M$, $Y_M$) (refer to FIG. 2). In turn, the coordinates of the rational grid point on the wafer corresponding to this alignment mark is defined as $a_L$ ($X_L$, $Y_L$). In the specification, when an appendix letter of "v" is added to a symbol or the like, this means a vector. In the case that the wafer is processed with a heat treatment or passed through various film forming steps or the like, the coordinates $a_L(X_L, Y_L)$ is not usually coincided with the coordinates $a_M(X_M, Y_M)$. If the measurement accuracy of the alignment marks can be ignored, a vector ($a_{MV}-a_{LV}$) which is a difference between a vector $a_{MV}$ and a vector $a_{LV}$ is a vector indicating a positional displacement from the rational grid points caused by a deformation of the wafer made by the manufacturing process of a semiconductor device or a positional displacement at the wafer stage during loading of the wafer (positional displacement after pre-alignment of the wafer).

Accordingly, in the case that the alignment is carried out, a conversion operation with a certain kind of conversion operand A is performed against a certain point $a_L$ on the rational grid point and then a residual vector $e_V$ between the vector $a_{TV}=Aa_{LV}$ and the vector $a_{MV}$ of the obtained point is calculated. Such an operation as above is carried out for a plurality of alignment marks (the number N). It is satisfactory that the conversion operand A is determined in such a way that a sum of the residual vector $e_V$ at each of the alignment marks may become minimum. Then, it is satisfactory that the coordinates $a_L$ of the rational grid point is converted into a coordinates $a_T$ in response to the conversion operand A, an alignment operation is carried out in response to the converted coordinates $a_T$ and an optical exposing shot is carried out to optically expose the resist.

More practically, the wafer stage system is operated such that an alignment displacement between the first pattern and the second pattern may become minimum in response to a positional displacement from the rational grid point of the measured alignment marks and the optical exposing shot layout for use in forming the second pattern is exposed while being displaced from the rational grid point.

Although a deformation of the wafer caused by a manufacturing process for the actual semiconductor device is complex, the following causes may be considered as the major causes:

(A) Offsets (shifts) dx and dy which are errors of the alignment marks in the directions X and Y, respectively.

(B) A rotation θ which is an error of the alignment mark in its rotating direction.

(C) An orthogonal degree of layout α which is an error in an orthogonal degree in a layout of each of the alignment marks, and (D) Scalings $S_x$, $S_y$ which are variation in multiplication factor of each of the alignment marks in the directions X and Y, respectively.

These technical concepts are illustrated in FIGS. 3A, 3B, 4A and 4B. Both (A) offsets (refer to FIG. 3A) and (B) rotation (refer to FIG. 3B) are caused by a loading of the wafer into the wafer stage. (C) orthogonal degree of layout (refer to FIG. 4A) is caused by an accuracy of the wafer stage when the first pattern is optically exposed. (D) scaling (refer to FIG. 4B) is caused by a manufacturing process element of a semiconductor device such as a film formation stage and the like. These causes (A) to (D) may not be necessarily separated in a clear manner. In FIGS. 3A, 3B, 4A and 4B, the rational grid points are connected by solid lines and the alignment marks on the deformed wafer are connected by dotted lines.

The related art stepping device performs a correction of alignment with these four causes being applied as major causes of variation. That is, the variation operand A is determined with the method of least squares in such a way that a sum of squares of residual of displacement between the coordinates of the alignment marks measured and the coordinates after the coordinates of the rational grid points corresponding to such alignment marks may become minimum in response to these causes. Then, an optical exposing shot layout for use in forming the second pattern is determined in response to the positional coordinates of the alignment marks (positional coordinates after correction of the alignment marks) obtained through a converting operation based on the conversion operand A.

The conversion operation related to each of the causes is expressed with a 2×2 matrix and the conversion operation of $$\begin{pmatrix} X_{Ti} \\ Y_{Ti} \end{pmatrix} = \begin{pmatrix} X_{Li}+dx \\ Y_{Li}+dy \end{pmatrix} \quad \text{Equation (7)}$$

is carried out for (A) offset, where dx and dy are errors (offsets) of the alignment marks in the directions X and Y, respectively. $X_{Ti}$ and $Y_{Ti}$ in the equation above are meant by the X coordinate and Y coordinate of the alignment mark $a_{Ti}$ of the i-th order [i=0 to (N−1)] after conversion. $X_{Li}$ and $Y_{Li}$ are meant by the X coordinate and Y coordinate of the rational grid point $a_{Li}$ of the i-th order [i=0 to (N−1)]. Similar relation is applied to the following equation.

As for the (B) rotation, the converting operation based on $$\begin{pmatrix} X_{Ti} \\ Y_{Ti} \end{pmatrix} = \begin{pmatrix} \cos\theta & \sin\theta \\ -\sin\theta & \cos\theta \end{pmatrix} \begin{pmatrix} X_{Li} \\ Y_{Li} \end{pmatrix} \quad \text{Equation (8)}$$

$$= \begin{pmatrix} 1 & \theta \\ -\theta & 1 \end{pmatrix} \begin{pmatrix} X_{Li} \\ Y_{Li} \end{pmatrix}$$

is carried out, where θ is an angle of rotation (unit: radian) and a value of θ during an actual alignment mark operation is in an order of $10^{-6}$ radian. Accordingly, there is no problem when sinθ=θ and cosθ=1 are set to be approximate to each other and the above equation can be attained.

In addition, as for (C) orthogonal degree of layout, the converting operation with the following equation $$\begin{pmatrix} X_{Ti} \\ Y_{Ti} \end{pmatrix} = \begin{pmatrix} 1 & \tan\alpha \\ 0 & 1 \end{pmatrix} \begin{pmatrix} X_{Li} \\ Y_{Li} \end{pmatrix} \quad \text{Equation (9)}$$

$$= \begin{pmatrix} 1 & \alpha \\ 0 & 1 \end{pmatrix} \begin{pmatrix} X_{Li} \\ Y_{Li} \end{pmatrix}$$

is carried out, where α expresses an orthogonal degree of layout (unit: radian) and a value of this α is $10^{-6}$ radian during an actual alignment mark operation. Accordingly, there is no problem if tanα=α is approximated, resulting in that the above equation may be obtained.

In turn, as for (D) scaling, the following conversion of $$\begin{pmatrix} X_{Ti} \\ Y_{Ti} \end{pmatrix} = \begin{pmatrix} 1+S_X & 0 \\ 0 & 1+S_Y \end{pmatrix} \begin{pmatrix} X_{Li} \\ Y_{Li} \end{pmatrix} \quad \text{Equation (10)}$$

is carried out, where $S_X$, $S_Y$ are values of scaling in the directions X and Y, respectively, and an order to become problem is a level of about 1 ppm.

In addition, assuming of complex of three converting operations of the equations (8), (9) and (10) mat result in the following equation, i.e.

$$\begin{pmatrix} X_{Ti} \\ Y_{Ti} \end{pmatrix} = \begin{pmatrix} 1 & \theta \\ -\theta & 1 \end{pmatrix} \begin{pmatrix} 1 & \alpha \\ 0 & 1 \end{pmatrix} \begin{pmatrix} 1+S_x & 0 \\ 0 & 1+S_y \end{pmatrix} \begin{pmatrix} X_{Li} \\ Y_{Li} \end{pmatrix} \quad \text{Equation (11)}$$

Since it may be assumed that $(\alpha+\theta)S_y=0$, $\theta \cdot S_x=0$ and $\alpha \cdot \theta=0$ can be attained, the equation (11) is changed and the following equation can be attained.

$$\begin{pmatrix} X_{Ti} \\ Y_{Ti} \end{pmatrix} = \begin{pmatrix} 1+S_x & \alpha+\theta \\ -\theta & 1+S_y \end{pmatrix} \begin{pmatrix} X_{Li} \\ Y_{Li} \end{pmatrix} \quad \text{Equation (12)}$$

Under such approximate conditions as above, these three converting operations can be converted. In addition, the coordinates $a_{Ti}(X_{Ti}, Y_{Ti})$ after correction of alignment (after converting operation) can be simply expressed under an assumption of positional displacements dx and dy caused by offset as follows;

$$X_{Ti}=(1+S_x)X_{Li}+(\alpha+\theta)Y_{Li}+dx \quad \text{Equation (13-1)}$$

$$Y_{Ti}=-\theta X_{Li}+(1+S_y)Y_{Li}+dy \quad \text{Equation (13-2)}$$

In this case, if it is assumed that $a=1+S_X$ $b=\alpha+\theta$ $c=dx$ $d=-\theta$ $e=1+S_Y$ $f=dy$ the equations (13-1) and (13-2) can be expressed as the following equations (14-1) and (14-2).

$$X_{Ti}=aX_{Li}+bY_{Li}+c \quad \text{Equation (14-1)}$$

$$Y_{Ti}=dX_{Li}+eY_{Li}+f \quad \text{Equation (14-2)}$$

Accordingly, if the measured coordinates of the i-th order of alignment mark are defined as $a_{Mi}(X_{Mi}, YMi)$, the residual values $E_{Xi}$ and $E_{Yi}$ can be expressed as follows:

$$E_{Xi} = X_{Mi} - X_{Ti} \quad \text{Equation (15-1)}$$
$$= X_{Mi} - (aX_{Li} + bY_{Li} + c)$$

$$E_{Yi} = Y_{Mi} - Y_{Ti} \quad \text{Equation (15-2)}$$
$$= Y_{Mi} - (dX_{Li} + eY_{Li} + f)$$

Then, coefficients a, b, c, d, e and f are determined in such a way that a sum of square of each of the residual values $E_{Xi}$ and $E_{Yi}$ concerning the alignment marks of the number of N ranging from 0-th alignment mark to the (N−1)-th alignment mark, i.e.

$$\Sigma E_{Xi}^2 = \Sigma [X_{Mi}-(aX_{Li}+bY_{Li}+c)]^2$$

$$\Sigma E_{Yi}^2 = \Sigma [Y_{Mi}-(dX_{Li}+eY_{Li}+f)]^2$$

may become minimum. Such a method as described above is the related art alignment method. That is, it is generally known that a proper amount of correction against each of the causes can be determined unconditionally through a method of least squares. In the present specification, the item "Σ" is meant by a sum of a physical amount (expressed by the equation subsequent to Σ) concerning the alignment marks of the number of N ranging from 0-th alignment mark to (N−1)-th alignment mark unless otherwise specified. Each of the coefficients is partially differentiated and put in order as follows.

$$\frac{\partial}{\partial a}\left(\sum_{i=0}^{N-1} E_{Xi}^2\right) = \qquad \text{Equation (16-1)}$$

$$\frac{\partial}{\partial b}\left(\sum_{i=0}^{N-1} E_{Xi}^2\right) = \frac{\partial}{\partial c}\left(\sum_{i=0}^{N-1} E_{Xi}^2\right)$$

$$\frac{\partial}{\partial d}\left(\sum_{i=0}^{N-1} E_{Yi}^2\right) = \qquad \text{Equation (16-2)}$$

$$\frac{\partial}{\partial e}\left(\sum_{i=0}^{N-1} E_{Yi}^2\right) = \frac{\partial}{\partial f}\left(\sum_{i=0}^{N-1} E_{Yi}^2\right)$$

Accordingly, in reference to the equations (16-1) and (16-2), $$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix}$$

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} Y_{Mi}X_{Li} \\ \sum_{i=0}^{N-1} Y_{Mi}Y_{Li} \\ \sum_{i=0}^{N-1} Y_{Mi} \end{pmatrix}$$

$a = 1 + S_X$
$b = \alpha + \theta$
$c = dx$
$d = -\theta$
$e = 1 + S_Y$
$f = dy$ may be attained. If B is defined as $$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} = B \qquad \text{Equation (17)}$$

each of the above two equations becomes $$\begin{pmatrix} a \\ b \\ c \end{pmatrix} B^{-1} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \qquad \text{Equation (18)}$$

$$\begin{pmatrix} d \\ e \\ f \end{pmatrix} B^{-1} = \begin{pmatrix} \sum_{i=0}^{N-1} Y_{Mi}X_{Li} \\ \sum_{i=0}^{N-1} Y_{Mi}Y_{Li} \\ \sum_{i=0}^{N-1} Y_{Mi} \end{pmatrix} \qquad \text{Equation (19)}$$

and it is possible to calculate six coefficients a, b, c, d, e and f. That is, it is possible to determine unconditionally the alignment coefficients dx, dy, $\theta$, $\alpha$, $S_x$, $S_y$. In other words, it is possible to analyze causes of the alignment displacement.

That is, it is well known in the related art alignment method that the most preferable correction of the alignment can be performed more easily and analytically in view of a technical concept of making sum of least squares of the residual values $E_{Xi}$ and $E_{Yi}$ through application of a method of least squares. That is, it is known that the most preferable correcting amount in alignment for making a sum of squares of residuals $E_{Xi}$, $E_{Yi}$ minimum can be analytically calculated only through getting an inverse matrix of the matrix B. Then, finally the residuals may result in only random components or high degree component of scaling which can not be corrected in view of principle.

Such a related art alignment method as described above is effective in the case that the random components which cannot be corrected by hardware normally installed on the stepping device in view of its principle are relatively near a normal distribution. However, in view of the actual structure of the semiconductor device, minimum setting of the sum of squares of residuals is not necessarily a necessary condition and may not necessarily make the most preferable correcting amount of alignment.

The alignment operation in the practical semiconductor device is defined as an operation in which two patterns designed in reference to an alignment displacement tolerance value set in response to an alignment accuracy which can be attained are overlapped from each other. Normally, the first pre-formed pattern shown in FIG. 15A (for example, an electrical wiring pattern) is designed to be larger than the second pattern (for example, a contact hole pattern) in reference to a displacement in alignment as shown in FIG. 15B. In this figure, the lengths $tol_X$ and $tol_Y$ designate alignment displacement tolerance values in the directions X and Y, and the alignment displacement values in the directions X and Y are designated by $\Delta X$ and $\Delta Y$, respectively. Accordingly, it may easily be understood that necessary and sufficient condition of alignment in manufacturing the semiconductor device consists in the fact that $\Delta X < tol_X$ \qquad Equation (20-1)

$\Delta Y < tol_Y$ \qquad Equation (20-2)

are fulfilled for all patterns. In other words, it is satisfactory that all the second patterns to be formed satisfy the equations (20-1) and (20-2), respectively. In turn, in the case that even a part of the second pattern is exposed out of the first pattern, i.e. even a part of the second pattern to be formed does not satisfy the equation (20-1) or (20-2), it becomes impossible to form a normal electrical contact, for example. In other words, it is necessary that an absolute value of difference between a positional coordinate after correction of the alignment mark and a measured coordinate of the alignment mark is set to be smaller than $tol_X$ and $tol_Y$.

However, it is not always found that a condition in which a sum of squares of residuals $E_{Xi}$, $E_{Yi}$ in the related art alignment method is made minimum is a condition capable of attaining the maximum number of normal contact holes or a condition in which all contact holes are normally formed. In other words, the condition in which the sum of squares of residuals $E_{Xi}$, $E_{Yi}$ is made minimum is not always coincided with the most preferable correcting condition of the alignment in the manufacturing of the semiconductor device.

In turn, even if the sum of squares of the residuals $E_{Xi}$, $E_{Yi}$ is not made minimum, there is an alignment condition to provide the most preferable alignment result in the manufacturing of a semiconductor device. In particular, in the case that the random component in the displacement component of the alignment mark from the rational grid point does not follow a so-called normal distribution, the related art alignment method for making the sum of squares of residuals minimum does not become preferable. The facts that deformation of the wafer passed through various manufacturing processes such as film forming stage or etching or heat treatment processes is complex and such random component does not follow the normal distribution may be frequently generated in the practical manufacturing process of the semiconductor device.

As described above, the related art alignment method in which a sum of squares of the residual is made minimum in order to make a minimum displacement between the position of the pattern to be formed in itself and the position of the pattern to be actually formed does not always provide the most preferable correcting condition of the alignment for the VLSI passed through various processes. This becomes remarkable in particular in the case that the random component in the displacement component of the alignment marks from the rational grid point does not follow a normal distribution.

SUMMARY OF THE INVENTION

It is an object of the present invention to provide a new alignment method in which the alignment can be carried out in reference to the most preferable correcting amount got by performing a statistical processing based on a measuring position of the alignment mark even in the case that the random component in the displacement component of the alignment mark from a rational grid point does not follow a normal distribution.

As shown in FIG. 15B, the related art alignment method is carried out such that a difference between a position (the second pattern forming planned region) where the second pattern (a contact hole pattern) is to be originally formed and a position where the second pattern is actually formed, i.e. the positional displacements $\Delta X$ and $\Delta Y$ of the second pattern in the directions X and Y are treated as the residuals $E_{Xi}$, $E_{Yi}$, respectively.

$$E_{Xi} = \Delta X$$

$$E_{Yi} = \Delta Y$$

In FIGS. 15 to 20, a layout relation between the first pattern and the second pattern is illustrated in order to facilitate its understanding. In these figures, the position where the second pattern (the contact hole pattern) is to be originally formed is equivalent to that of the point resulting from converting operation of the rational grid point. In turn, the position where the second pattern is to be formed is equivalent to a position where an alignment mark related to the first pattern is measured.

In this related art alignment method as described above, although it is easy to make an analytical calculation of a minimum value of sum of squares of the residuals, it does not always satisfy the necessary condition in the correction of the alignment as described above in view of the pattern formation of the actual semiconductor device. In view of the fact above, the present invention employs a new method for evaluating displacement in alignment in reference to a structure of the actual semiconductor device and a necessary condition to be satisfied for alignment work.

That is, the first alignment method of the present invention for accomplishing the aforesaid object is an alignment method in an optical exposing method for a semiconductor device in which after a resist is formed on the first pattern formed on the wafer, the resist is optically exposed to form the second pattern on the resist and then a position where the second pattern for the first pattern is to be formed is determined in response to the measurement of the positions of the alignment marks of the number of N associated with the first pattern formed on the wafer. Then, at first, the alignment correction coefficients dx, dy, $\theta$, $\alpha$, $S_X$, $S_Y$ are calculated by a method of least squares in reference to the coordinates $(X_{Mi}, Y_{Mi})$ of each of the alignment marks and the coordinates $(X_{Li}, Y_{Li})$ of the rational grid point corresponding to each of the alignment marks in the same manner as that of the related art alignment method.

After this operation, the corrected coordinates $(X_{Ti}, Y_{Ti})$ of the alignment mark are calculated in reference to the coordinates $(X_{Li}, Y_{Li})$ of the rational grid point corresponding to each of the alignment marks on the basis of the alignment mark correction coefficients and each of their random number elements. Then, $$\Delta X_{il} = X_{Mi} - X_{Ti}$$

$$\Delta Y_{il} = Y_{Mi} - Y_{Ti}$$

are calculated and the residuals $E_{Xil}$, $E_{Yil}$ at each of the alignment marks are determined in reference to the following rule on the basis of the alignment displacement tolerance values $tol_X$ and $tol_Y$ in the predetermined directions X and Y which are alignment displacement values allowable in design of the semiconductor device.

(A) In the case that $|\Delta X_{il}| \leq tol_X$ and $|\Delta Y_{il}| \leq tol_Y$ are set:

$$E_{Xil} = 0$$

$$E_{Yil} = 0$$

(B) In the case that $|\Delta X_{il}| > tol_X$ and $|\Delta Y_{il}| > tol_Y$ are set:

$$E_{Xil} = |\Delta X_{il}| - tol_X$$

$$E_{Yil} = |\Delta Y_{il}| - tol_Y$$

(C) In the case that $|\Delta X_{il}| \leq tol_X$ and $|\Delta Y_{il}| > tol_Y$ are set:

$$E_{Xil} = 0$$

$$E_{Yil} = |\Delta Y_{il}| - tol_Y$$

(D) In the case that $|\Delta X_{il}| \leq tol_X$ and $|\Delta Y_{il}| \leq tol_Y$ are set:

$$E_{Xil} = |\Delta X_{il}| - tol_X$$

$$E_{Yil} = 0$$

Then, in view of these residuals $E_{Xil}$, $E_{Yil}$, a sum of residual squares $R_1 = \Sigma E X_{il}^2 + \Sigma E Y_{il}^2$ is calculated.

Then, the aforesaid stages are carried out for a plurality of times with the alignment correction coefficients added with the random number elements being applied as new alignment correction coefficients. Lastly, the corrected coordinates $(X_{TiF}, Y_{TiF})$ of the alignment mark associated with the first pattern for use in optically exposing the second pattern are calculated in reference to the alignment mark correction coefficients and each of their random number elements when the residual sum of squares $R_1 = \Sigma E X_{il}^2 + \Sigma E Y_{il}^2$ becomes a minimum value.

Then, the second alignment method of the present invention will be described in summary.

In the case that a pattern is to be formed in the semiconductor device by applying a reducing optical system, in particular, in the case that the formed pattern size is approximate to a limited resolution degree found in the reducing optical system, the pattern to be formed is remarkably deformed from the design pattern. Accordingly, even in the case of the first alignment method of the present invention, the alignment displacement allowable values required in performing a design of the semiconductor device must be set more rationally in response to the pattern shape to be actually formed.

In the second alignment method of the present invention, the residuals $E_{Xii}$, $E_{Yii}$ at each of the alignment marks in the first alignment method are determined by changing them to the following rules.

(A') In the case that $\Delta X_{ii}^2 + \Delta Y_{ii}^2 \leq tol_X^2 + tol_Y^2$:

$$E_{Xii} = 0$$

$$E_{Xii} = 0$$

(B') In the case that $\Delta X_{ii}^2 + \Delta Y_{ii}^2 > tol_X^2 + tol_Y^2$:

$$E_{Xii}^2 + E_{Yii}^2 = \Delta X_{ii}^2 + \Delta Y_{ii}^2 - (tol_X^2 + tol_Y^2)$$

In the actual manufacturing process for the semiconductor device, displacement from the design pattern may easily occur due to various causes. In view of this fact, in the second alignment method of the present invention, it is preferable that the alignment displacement allowable values are set for each of the regions every time they are set in response to the pattern shape of the first pattern actually formed.

Then, a third alignment method of the present invention will be described in summary.

There occurs sometimes that the first pattern and the second pattern are already formed and a third pattern is concurrently formed in respect to these first and second patterns. In such a case as above, it is necessary that the alignment displacement allowable values are set in reference to the alignment displacement amount between the lower layer patterns (between the first pattern and the second pattern) formed prior to the formation of the third pattern.

That is, the third alignment method of the present invention for accomplishing the aforesaid object is an alignment method in an optical exposing method for a semiconductor device wherein a resist is formed on the first pattern and the second pattern formed on the wafer, then the resist is optically exposed to form the third pattern on such resist as above, and a position where the third pattern against the first pattern and the second pattern is to be formed is determined in response to the measurement of the positions of the alignment marks of the number of N associated with the first pattern formed on the wafer. Then, at first, the position of the alignment mark associated with the first pattern is measured and concurrently the position of the alignment mark associated with the second pattern is measured, and the alignment displacement amounts $\Delta e_{xi}$, $\Delta e_{yi}$ at each of the alignment marks are calculated in reference to a result of such measurement.

Then, the alignment correction coefficients dx, dy, θ, α, $S_X$ and $S_Y$ associated with the first pattern are calculated by a method of least squares in reference to the coordinates $(X_{Mi}, Y_{Mi})$ of each of the alignment marks and the coordinates $(X_{Li}, Y_{Li})$ of the rational grid point corresponding to each of the alignment marks in the same manner as that of the related art alignment method.

After this operation, the correction coordinates $(X_{Tii}, Y_{Tii})$ of the alignment mark are calculated in reference to the coordinates $(X_{Li}, Y_{Li})$ of the rational grid point corresponding to each of the alignment marks on the basis of the alignment mark correction coefficients and each of the random number elements. Then, $$\Delta X_{ii} = X_{Mi} - X_{Tii}$$

$$\Delta Y_{ii} = Y_{Mi} - Y_{Tii}$$

are calculated.

Then, the new alignment displacement allowable values $tol_X'$ and $tol_Y'$ in the directions X and Y are determined in accordance with the following rule on the basis of the predetermined alignment displacement tolerance values $tol_X$, $tol_Y$ in the directions X and Y which are alignment displacement values allowable in design of the semiconductor device, the predetermined alignment displacement values $\Delta e_{xi}$, $\Delta e_{yi}$, the above-mentioned values $\Delta X_{ii}$, $\Delta Y_{ii}$ where in the case that the values of $tol_X'$, $tol_Y'$ are in negative sign, they are assumed to be 0.

In the case of (x-1) $\Delta e_{xi} \geq 0$ and $\Delta X_{i0} \geq 0$:
$tol_X' = tol_X$ In the case of (x-2) $\Delta e_{xi} \geq 0$ and $\Delta X_{i0} < 0$:
$tol_X' = tol_X - |\Delta e_{xi}|$ In the case of (x-3) $\Delta e_{xi} < 0$ and $\Delta X_{i0} \geq 0$:
$tol_X' = tol_X - |\Delta e_{xi}|$ In the case of (x-4) $\Delta e_{xi} < 0$ and $\Delta X_{i0} < 0$:
$tol_X' = tol_X$ In the case of (y-1) $\Delta e_{yi} \geq 0$ and $\Delta Y_{i0} \geq 0$:
$tol_Y' = tol_Y$ In the case of (y-2) $\Delta e_{yi} \geq 0$ and $\Delta Y_{i0} < 0$:
$tol_Y' = tol_Y - |\Delta e_{yi}|$ In the case of (y-3) $\Delta e_{yi} < 0$ and $\Delta Y_{i0} \geq 0$:
$tol_Y' = tol_Y - |\Delta e_{yi}|$ In the case of (y-4) $\Delta e_{yi} < 0$ and $\Delta Y_{i0} < 0$:
$tol_Y' = tol_Y$ Then, the residuals $E_{Xi0}$, $E_{Yi0}$ at each of the alignment marks are determined in accordance with the following rule.

(A) In the case of $|\Delta X_{ii}| \leq tol_X'$ and $|\Delta Y_{ii}| \leq tol_Y'$:

$$E_{Xii} = 0$$

$$E_{Yii} = 0$$

(B) In the case of $|\Delta X_{ii}| > tol_X'$ and $|\Delta Y_{ii}| > tol_Y'$:

$$E_{Xii} = |\Delta X_{ii}| - tol_X'$$

$$E_{Yii} = |\Delta Y_{ii}| - tol_Y'$$

(C) In the case of $|\Delta X_{ii}| \leq tol_X'$ and $|\Delta Y_{ii}| > tol_Y'$:

$$E_{Xii} = 0$$

$$E_{Yii} = |\Delta Y_{ii}| - tol_Y'$$

(D) In the case of $|\Delta X_{ii}| > tol_X'$ and $|\Delta Y_{ii}| \leq tol_Y'$:

$$E_{Xii} = |\Delta X_{ii}| - tol_X'$$

$$E_{Yii} = 0$$

Then, the residual sum of squares $R_1 = \Sigma E_{Xii}^2 + \Sigma E_{Yii}^2$ is calculated in reference to these residuals $E_{Xii}$ and $E_{Yii}$.

Then, the aforesaid steps are carried out for a plurality of times with the alignment correction coefficients added with the random number elements being applied as new alignment correction coefficients. Lastly, the corrected coordinates $(X_{TiF}, Y_{TiF})$ of the alignment mark associated with the first pattern for use in optically exposing the third pattern are calculated in reference to the alignment mark correction coefficients and their random number elements when the residual sum of squares $R_1 = \Sigma E_{Xii}^2 + \Sigma E_{Yii}^2$ becomes a minimum value.

The fourth alignment method of the present invention is approximately similar to the second alignment method of the present invention. That is, in the fourth alignment method of the present invention, the residuals $E_{Xil}$ and $E_{Yil}$ at each of the alignment marks in the third alignment method are determined by being changed in accordance with the following rule.

(A') In the case that $\Delta X_{il}^2 + \Delta Y_{il}^2 \leq tol_X'^2 + tol_Y'^2$:

$E_{Xil}=0$ $E_{Yil}=0$ (B') In the case that $\Delta X_{il}^2 + \Delta Y_{il}^2 > tol_X'^2 + tol_Y'^2$:

$E_{Xil}^2 + E_{Yil}^2 = \Delta X_{il}^2 + \Delta Y_{il}^2 - (tol_X'^2 + tol_Y'^2)$:

In the actual manufacturing process for a semiconductor device, a displacement from the design pattern may easily be generated due to various causes. In view of this fact, it is preferable in the fourth alignment method of the present invention that the alignment displacement tolerance value is set for each of the regions every time in response to the pattern shape of the already formed actual pattern.

In the alignment method of the present invention, the residuals $E_{Xil}$, $E_{Yil}$ are determined in response to the predetermined alignment displacement tolerances $tol_{Xil}$, $tol_{Yil}$ in the directions X and Y, respectively. Then, the most preferable values of the alignment correction coefficients dx, dy, θ, α, $S_X$ and $S_Y$ when the sum of residual squares $\Sigma E_{Xil}^2 + \Sigma E_{Yil}^2$ becomes minimum are calculated by an iterative solution. With such an arrangement as above, even if the random component in the displacement components of the alignment marks from the rational grid points does not follow the normal distribution, it is possible to get the most preferable amount of correction of the alignment with the result that the alignment under the most preferable condition can be carried out.

There is no problem at all wherever the contact hole may be formed in the region in the case that the contact hole is formed, for example, in the semiconductor device if a contact hole is formed in a region where an electrical contact can be stably assured. In the case that the displacement component of the alignment mark from the rational grid point follows the normal distribution, it is possible to get the most preferable correcting amount of the alignment in such a way that the sum of residual squares may become minimum. Then, even in the case that the contact hole is formed in the region where an electrical contact can be stably assured, the most preferable alignment correction amount is calculated in such a way that a residual between a rational forming position of the contact hole and a planned forming position of the contact hole may always approach 0. As a result, in the case that the random component in the displacement component in the alignment mark from the rational grid point does not follow the normal distribution, there occurs sometimes that a contact hole is not formed in the region where the electrical contact can be stably assured under an alignment method based on the related art method of least squares and then an improper optical exposing shot may be generated when the resist is optically exposed.

If the contact hole is formed in the region where an electrical contact can be stably assured, there is no problem that the contact hole may be formed in any region as above, resulting in that the residuals $E_{Xil}$, $E_{Yil}$ in each of the alignment marks in the present invention are defined to be 0 in the case that $|X_{il}| \leq tol_X$ and $|\Delta Y_{il}| \leq tol_Y$ are attained. In turn, for example, in the case that $|\Delta X_{il}| > tol_X$ and $|\Delta X_{il}| > tol_Y$ are attained, the most preferable values of the alignment correction coefficients dx, dy, θ, α, $S_X$, $S_Y$ when the sum of residual squares $\Sigma E_{Xil}^2 + \Sigma E_{Yil}^2$ become minimum under a relation of $E_{Xil} = |\Delta X_{il}| - tol_X$ and $E_{Yil} = |\Delta Y_{il}| - tol_Y$, respectively, are calculated by the interactive solution.

BRIEF DESCRIPTION OF THE DRAWINGS

FIG. 5 is a flowchart for showing each of the steps in the alignment method in the first preferred embodiment of the present invention.

FIG. 19 is a view for showing technical concepts of $\Delta X_{il}$, $\Delta Y_{il}$, $tol_X$, $tol_Y$ and residuals $E_{Xil}$, $E_{Yil}$ in the alignment method of the third preferred embodiment of the present invention.

FIG. 20 is a view for showing technical concepts of $\Delta X_{il}$, $\Delta Y_{il}$, $tol_X$, $tol_Y$ and residuals $E_{Xil}$, $E_{Yil}$ in the alignment method of the third preferred embodiment of the present invention.

FIG. 21 is a view of a frequency distribution in displacement between positional coordinates $(X_{Mi}, Y_{Mi})$ of the alignment mark in the first pattern and coordinates $(X_{Li}, Y_{Li})$ of the rational grid points corresponding to each of the alignment marks before and after the alignment correction for showing a result of the first experiment in the first preferred embodiment of the present invention.

FIG. 22 is a view of a frequency distribution in displacement of the corrected coordinates $(X_{TiF}, Y_{TiF})$ of each of the alignment marks from the coordinates $(X_{Li}, Y_{Li})$ of the rational grid point corresponding to each of the alignment marks in the case that the alignment correction is carried out through the related art alignment method.

FIG. 23 is a view of a frequency distribution in displacement of the corrected coordinates $(X_{TiF}, Y_{TiF})$ of each of the alignment marks from the coordinates $(X_{Li}, Y_{Li})$ of the rational grid point corresponding to each of the alignment marks in the case that the alignment correction is carried out in reference to a result of experiment of the first preferred embodiment of the present invention.

FIG. 24 is a view of a frequency distribution in displacement of the corrected coordinates $(X_{TiF}, Y_{TiF})$ of each of the alignment marks from the coordinates $(X_{Li}, Y_{Li})$ of the rational grid point corresponding to each of the alignment marks in the case that the alignment correction is carried out through the related art alignment method separate from that of FIG. 22.

FIG. 25 is a view of a frequency distribution in displacement of the corrected coordinates $(X_{TiF}, Y_{TiF})$ of each of the alignment marks from the coordinates $(X_{Li}, Y_{Li})$ of the rational grid point corresponding to each of the alignment marks in the case that the alignment correction is carried out in reference to the result of the second experiment of the present invention.

DETAILED DESCRIPTION OF THE PREFERRED EMBODIMENTS

The alignment method of the first preferred embodiment of the present invention is an alignment method in an optical exposing method for a semiconductor device in which a resist is formed on a first pattern formed on a wafer, thereafter the resist is optically exposed to form a second pattern on the resist, wherein a position where the second pattern in respect to the first pattern is to be formed is determined on the basis of a measurement of the positions of the alignment marks of the number of N associated with the first pattern formed on the wafer.

It is impossible or quite hard, being different from the related art alignment method, to perform an analytical and unconditional getting of the alignment correction coefficients dx, dy, $\theta$, $\alpha$, $S_X$, $S_Y$ for minimizing a residual sum of squares $\Sigma E_{Xil}^2 + \Sigma E_{Yil}^2$ in response to the alignment displacements $E_{Xil}$, $E_{Yil}$ newly defined in the present invention. In addition, an optimization process for a continuous function under an assumption of a monotone decreasing down to a minimum value of the evaluation function such as Newton method or a method of steepest descent cannot be applied either due to a presence of limitless number of local minimum values for the evaluation function. In view of this fact, in the present invention, optimal values of the alignment correction coefficients dx, dy, $\theta$, $\alpha$, $S_X$, $S_Y$ are calculated by the iterative solution in which Monte Carlo method is applied.

Figure 6:
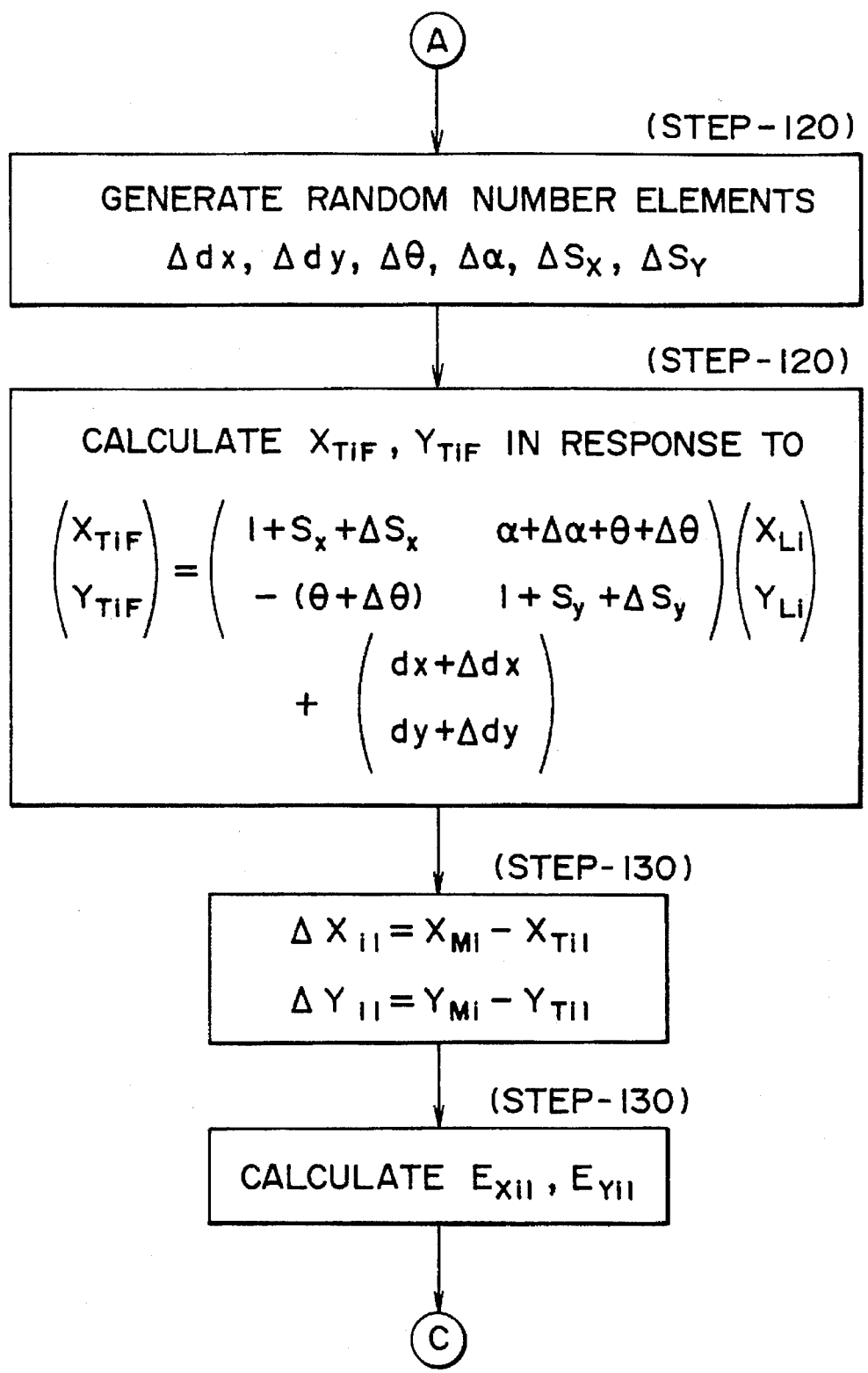
FIG. 6 is a flowchart subsequent to FIG. 5 for showing each of the steps in the alignment method in the first preferred embodiment of the present invention.
Figure 7:
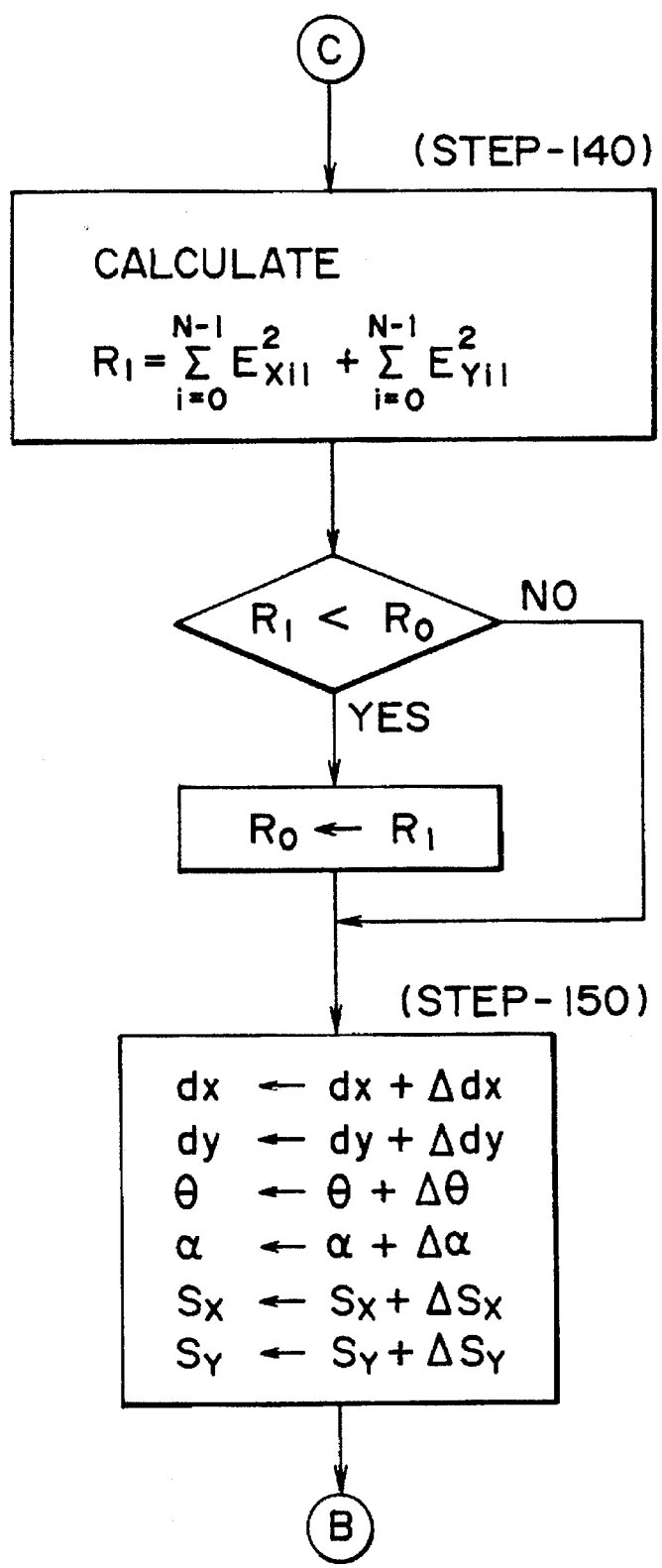
FIG. 7 is a flowchart subsequent to FIG. 6 for showing each of the steps of an alignment method in the first preferred embodiment of the present invention.

Referring now to the flowcharts of FIGS. 5 to 7, each of the steps in the alignment method concerning the first preferred embodiment of the present invention will be described more practically.

[Step-100]

Positions of the alignment marks of the number of N associated with the first pattern are measured, and then the coordinates $(X_{Mi}, Y_{Mi})$ (where, i=0, 1, 2 . . . , N–1) of each of the alignment marks are calculated in reference to the result of such measurement. In this case, the appendix "i" designates the i-th alignment mark. Measurement of the alignment mark can be performed by applying an alignment mark sensing system of TTL (Through The Lens) on-axis type, an alignment mark sensing system of TTL off-axis type or an alignment mark sensing system of off-axis type.

[Step-110]

Under an assumption that the offsets of errors of the alignment marks in the directions X and Y are defined as dx and dy, a rotation of an error of the alignment mark in its rotating direction is defined as $\theta$, an orthogonal degree of layout which is an error of the orthogonal degree in the layout in each of the alignment marks is defined as $\alpha$ and scalings which are variations in magnification of the alignment marks in the directions X and Y are defined as $S_X$, $S_Y$, the alignment correction coefficients dx, dy, $\theta$, $\alpha$, $S_X$, $S_Y$ are calculated by a method of least squares based on the following equations (1) and (2) in reference to the coordinates $(X_{Mi}, Y_{Mi})$ of each of the alignment marks and the coordinates $(X_{Li}, Y_{Li})$ of the rational grid point corresponding to each of the alignment marks. This process is similar to the related art alignment method.

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Ni}X_{Li} \\ \sum_{i=0}^{N-1} X_{Ni}Y_{Li} \\ \sum_{i=0}^{N-1} X_{Ni} \end{pmatrix}$$

Equation (1)

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} Y_{Ni}X_{Li} \\ \sum_{i=0}^{N-1} Y_{Ni}Y_{Li} \\ \sum_{i=0}^{N-1} Y_{Ni} \end{pmatrix}$$

Equation (2)

Figure 1:
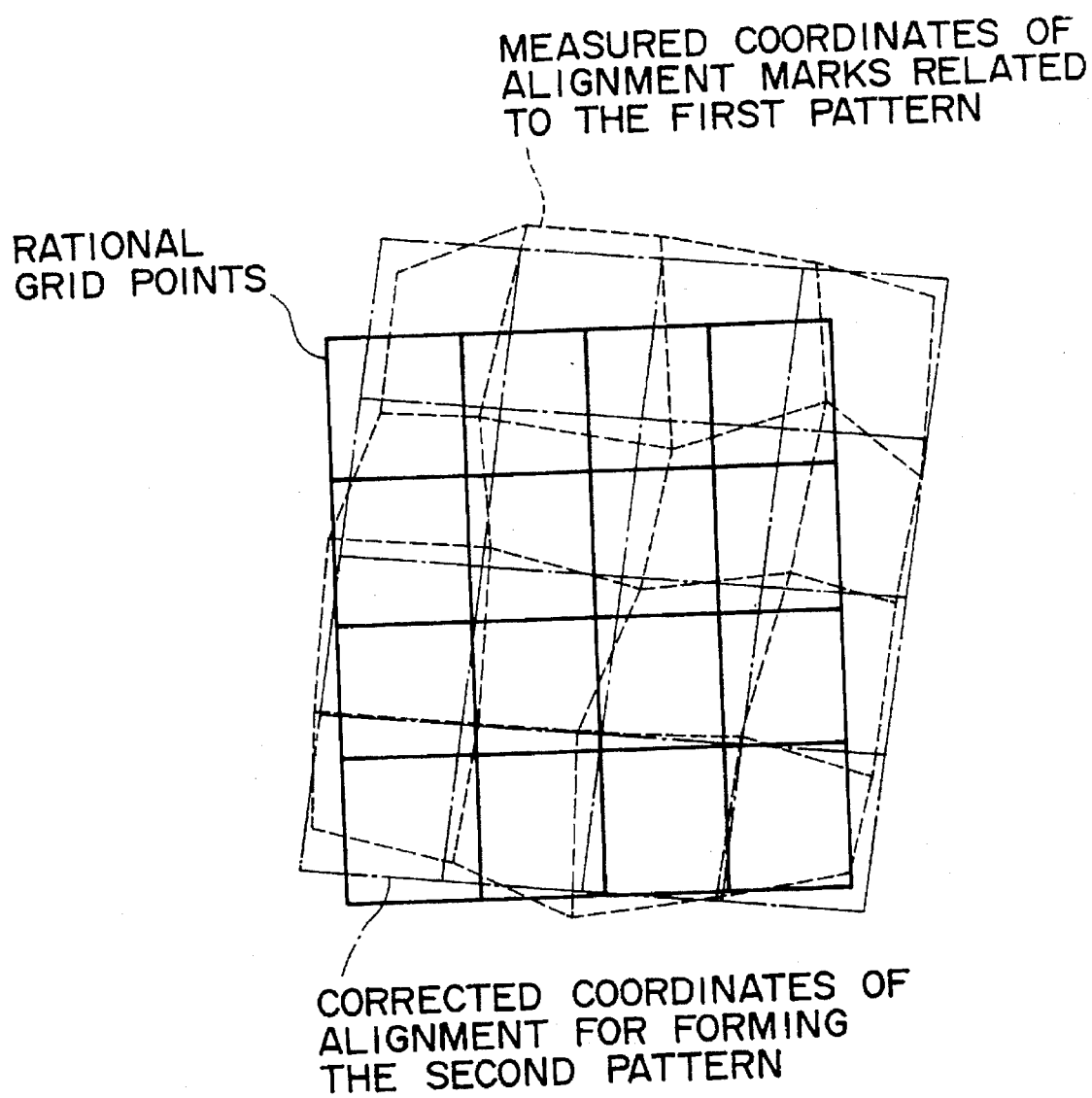
FIG. 1 is a general technical concept view for showing the related art alignment method.
Figure 2:
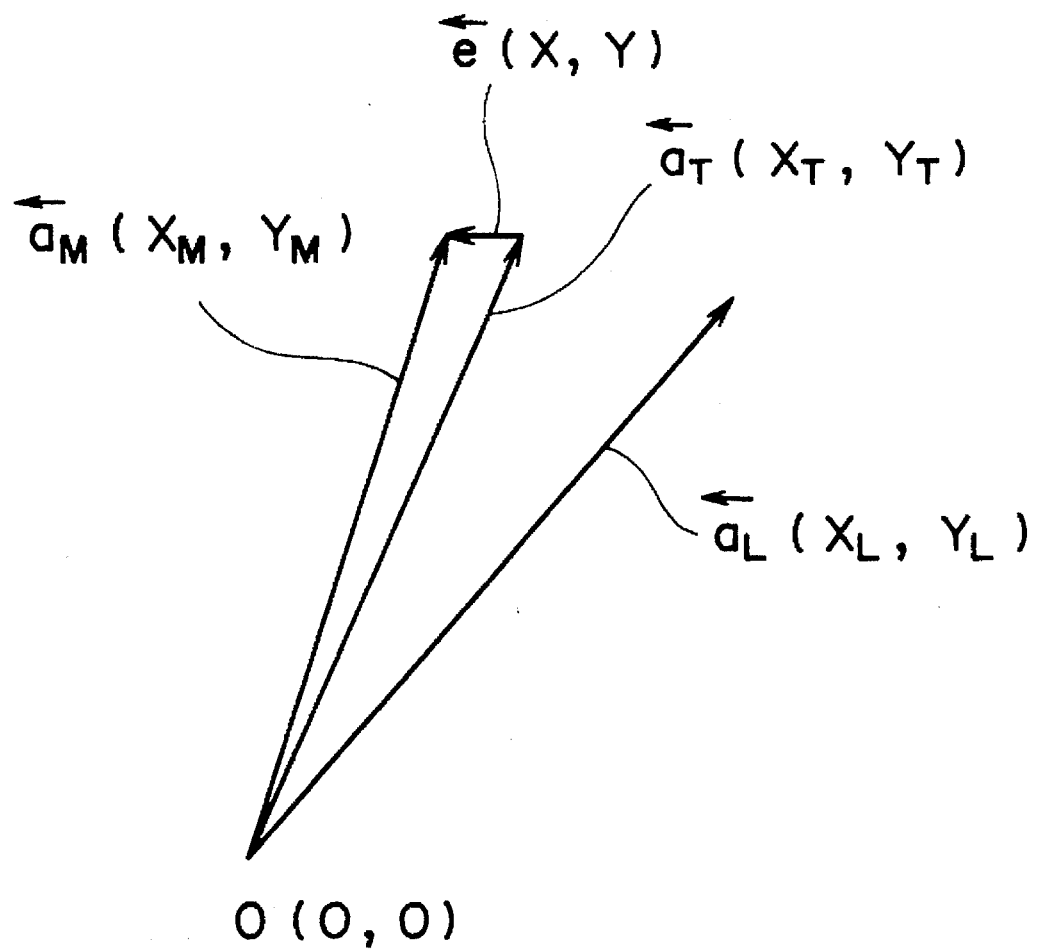
FIG. 2 is a schematic illustration for showing a measuring point of an alignment mark, a rational grid point and a conversion of the rational grid point in the related art.
Figure 3A:
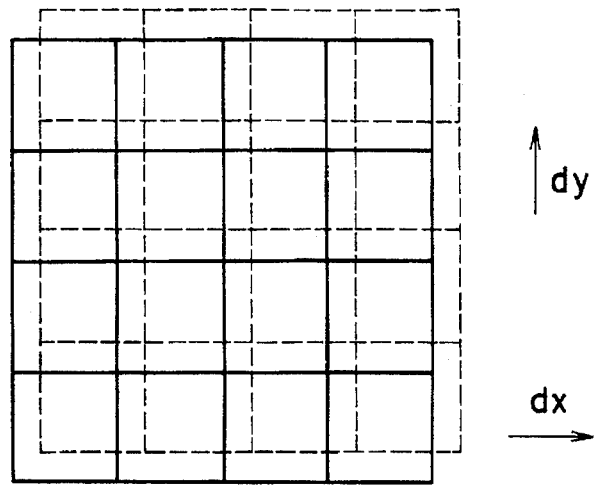
FIGS. 3A and 3B are schematic illustrations for showing causes of deformation of the related art wafer.
Figure 3B:
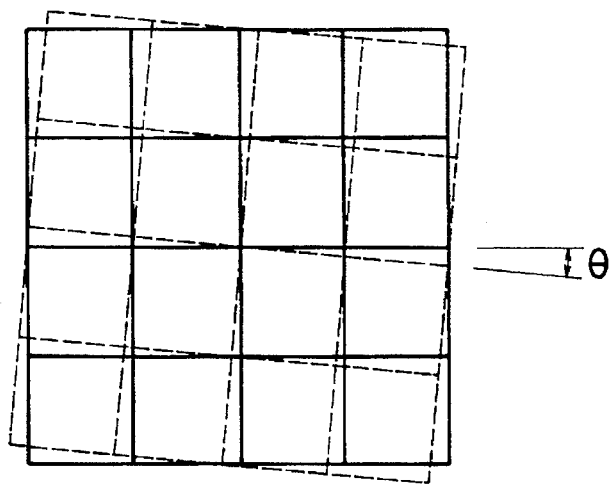
Figure 4A:
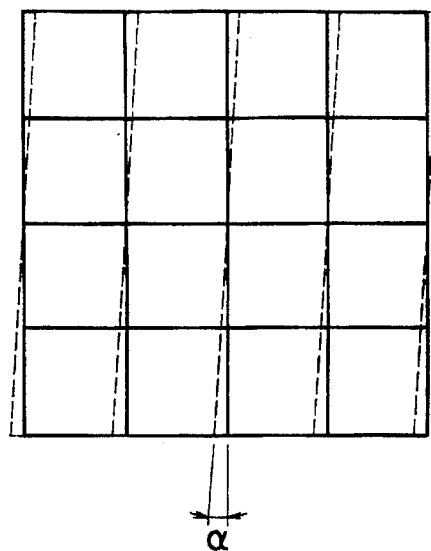
FIG. 4A and 4B are schematic illustrations for showing causes of deformation of the related art wafer.
Figure 4B:
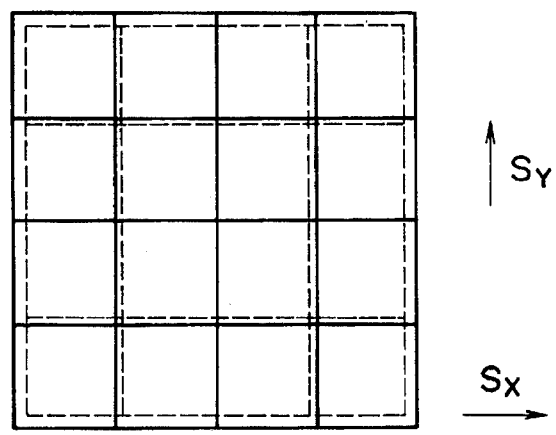

-continued $a = 1 + S_X$ $b = \alpha + \theta$ $c = dx$ $d = -\theta$ $e = 1 + S_Y$ $f = dy$ The concepts of these alignment correction coefficients dx, dy, $\theta$, $\alpha$, $S_X$, $S_Y$ are as indicated in FIGS. 3 and 4. In addition, these alignment correction coefficients dx, dy, $\theta$, $\alpha$, $S_X$, $S_Y$ are used as the initial values in the following steps.

Proper value is set in advance as a residual sum of squares used in the following steps.

[Step-120]

Then, the random number elements $\Delta dx$, $\Delta dy$, $\Delta\theta$, $\Delta\alpha$, $\Delta S_X$, $\Delta S_Y$ associated with each of the alignment correction coefficients dx, dy, $\theta$, $\alpha$, $S_X$, $S_Y$ are generated. Then, the correction coordinates $(X_{Ti1}, Y_{Ti1})$ of the alignment mark are calculated in reference to the following equation (3) on the basis of the alignment correction coefficients dx, dy, $\theta$, $\alpha$, $S_X$, $S_Y$ and each of the random number elements $\Delta dx$, $\Delta dy$, $\Delta\theta$, $\Delta\alpha$, $\Delta S_X$, $\Delta S_Y$.

$$\begin{pmatrix} X_{Ti1} \\ Y_{Ti1} \end{pmatrix} = \begin{pmatrix} 1 + S_x + \Delta S_x & \alpha + \Delta\alpha + \theta + \Delta\theta \\ -(\theta + \Delta\theta) & 1 + S_y + \Delta S_y \end{pmatrix} \begin{pmatrix} X_{Li} \\ Y_{Li} \end{pmatrix} + \begin{pmatrix} dx + \Delta dx \\ dy + \Delta dy \end{pmatrix} \quad \text{Equation (3)}$$

In this equation, each of the random number elements is a normal random number and determined by a computer in reference to some experimental data on the basis of try-and-error manner. In general, the correction coordinates $(X_{Ti1}, Y_{Ti1})$ of the alignment marks obtained from the above equation (9) and the residual sum of squares $R_1$ obtained by the following steps are deteriorated more than the residual sum of squares $R_1$ obtained by the equation (3) and the following steps with all the random number elements $\Delta dx$, $\Delta dy$, $\Delta\theta$, $\Delta\alpha$, $\Delta S_X$, $\Delta S_Y$ being set to be 0 if the distribution range of the random number elements is too wide. In turn, if the distribution range of the random number elements is too narrow, the residual sum of squares $R_1$ obtained by the following steps is improved, although a speed of conversion toward the most preferable value becomes quite slow, resulting in that it requires a large amount of time.

[Step-130]

Then, $\Delta X_{ii} = X_{Mi} - X_{Ti1}$ $\Delta Y_{ii} = Y_{Mi} - Y_{Ti1}$ are calculated. In addition, each of the values of alignment displacements (alignment displacement tolerances) $tol_X$, $tol_Y$ which can be allowed in design of a semiconductor device is set in advance in each of the directions X and Y, respectively. The residuals $E_{Xii}$, $E_{Yii}$ at each of the alignment marks are determined in response to such $tol_X$, $tol_Y$, respectively, in accordance with the following rule.

(A) In the case that $|\Delta X_{ii}| \leq tol_X$ and $|\Delta Y_{ii}| \leq tol_Y$ (refer to FIG. 15B):

$E_{Xii} = 0$ $E_{Yii} = 0$

That is, the alignment displacements within the set alignment displacement tolerances ($tol_X$, $tol_Y$) are set to be 0 and equally handled. Because, there occurs no problem in view of an actual structure of a semiconductor device whatever any pattern positional displacement may be generated within the range of the alignment displacement tolerances. In other words, $tol_X$ and $tol_Y$ are set in such a way that there occurs no problem in view of an actual structure of a semiconductor device whatever any pattern positional displacement may occur within the range of alignment displacement tolerances.

Figure 16A:
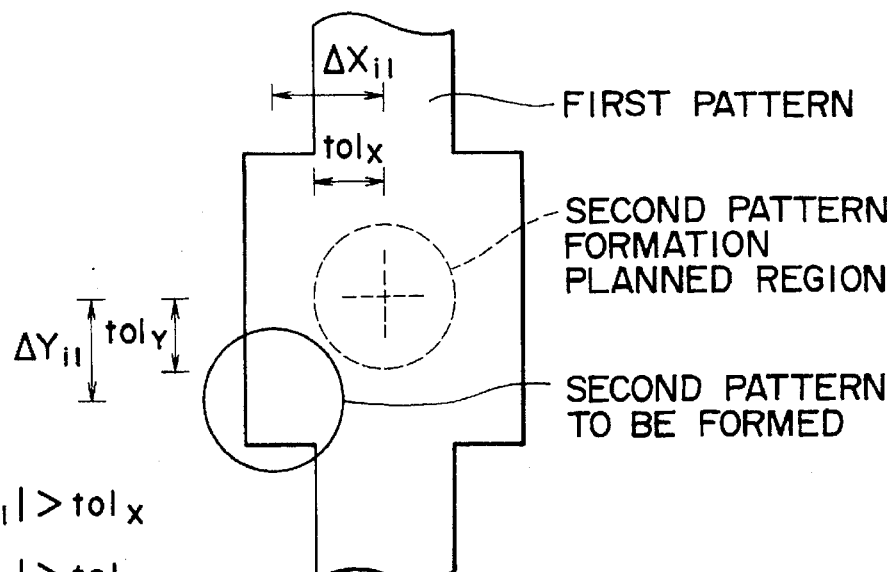
FIGS. 16A and 16B are views for showing technical concepts of $\Delta X_{il}$, $\Delta Y_{il}$, $tol_X$, $tol_Y$ and residuals $E_{Xil}$, $E_{Yil}$ in the alignment method of the first preferred embodiment of the present invention.

(B) In the case that $|\Delta X_{ii}| > tol_X$ and $|\Delta Y_{ii}| > tol_Y$ (refer to FIG. 16A):

$E_{Xii} = |\Delta X_{ii}| - tol_X$ $E_{Yii} = |\Delta Y_{ii}| - tol_Y$

That is, the alignment displacement values exceeding the alignment displacement tolerances ($tol_X$, $tol_Y$) are defined as alignment displacements.

Figure 16B:
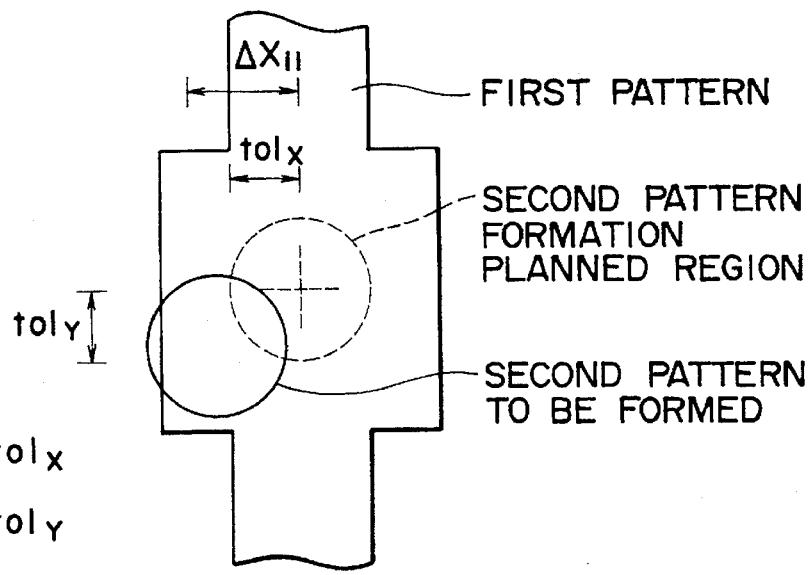
Figure 17:
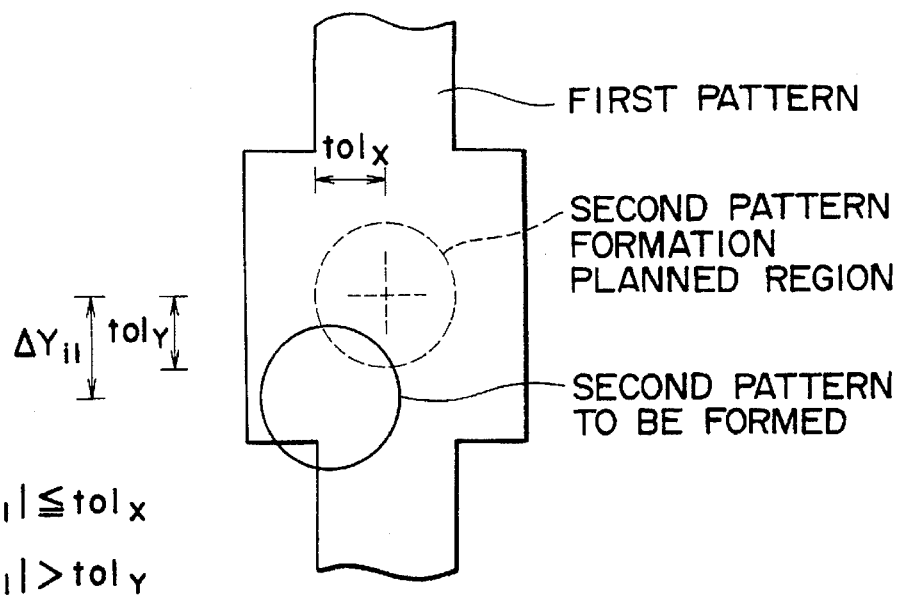
FIG. 17 is a view for showing technical concepts of $\Delta X_{il}$, $\Delta Y_{il}$, $tol_X$, $tol_Y$ and residuals $E_{Xil}$, $E_{Yil}$ in the alignment method of the first preferred embodiment of the present invention.

(C) In the case that $|\Delta X_{ii}| \leq tol_X$ and $|\Delta Y_{ii}| > tol_Y$ (refer to FIG. 16B):

$E_{Xii} = 0$ $E_{Yii} = |\Delta Y_{ii}| - tol_Y$ (D) In the case that $|\Delta X_{ii}| > tol_X$ and $|\Delta Y_{ii}| \leq tol_Y$ (refer to FIG. 17):

$E_{Xii} = |\Delta X_{ii}| - tol_X$ $E_{Yii} = 0$

[Step-140]

The residual sum of squares $R_1$ is calculated in reference to these residuals $E_{Xii}$, $E_{Yii}$ on the basis of the following equation (4) and in the case that the calculated residual sum of squares $R_1$ is smaller than the residual sum of squares $R_0$, $R_1$ is defined as a new $R_0$.

$$R_1 = \sum_{i=0}^{N-1} E_{Xi1}^2 + \sum_{i=0}^{N-1} E_{Yi1}^2 \quad \text{Equation (4)}$$

[Step-150]

The [step-120] to [step-140] are repeated by a plurality of times while the alignment correction coefficients dx, dy, $\theta$, $\alpha$, $S_X$, $S_Y$ added with random number elements $\Delta dx$, $\Delta dy$, $\Delta\theta$, $\Delta\alpha$, $\Delta S_X$, $\Delta S_Y$ are being applied as new alignment correction coefficients dx, dy, $\theta$, $\alpha$, $S_X$, $S_Y$. That is, the [step-120] to [step-140] are repeated by a plurality of times (for example, a predetermined number of times) while each of dx+$\Delta dx$, dy+$\Delta dy$, $\theta$+$\Delta\theta$, $\alpha$+$\Delta\alpha$, $S_X$+$\Delta S_X$, $S_Y$+$\Delta S_Y$ is applied as new alignment correction coefficients dx, dy, $\theta$, $\alpha$, $S_X$, $S_Y$.

[Step-160]

Then, the corrected coordinates $(X_{TiF}, Y_{TiF})$ of the alignment mark associated with the first pattern for optically exposing the second pattern are calculated by the following equation (5) on the basis of the alignment correction coefficients dx, dy, $\theta$, $\alpha$, $S_X$, $S_Y$ when the minimum residual sum of squares $R_1$ is obtained and each of the random number elements $\Delta dx$, $\Delta dy$, $\Delta\theta$, $\Delta\alpha$, $\Delta S_X$, $\Delta S_Y$.

$$\begin{pmatrix} X_{TiF} \\ Y_{TiF} \end{pmatrix} = \quad \text{Equation (5)}$$

-continued $$\begin{pmatrix} 1+S_x+\Delta S_x & \alpha+\Delta\alpha+\theta+\Delta\theta \\ -(\theta+\Delta\theta) & 1+S_y+\Delta S_y \end{pmatrix} \begin{pmatrix} X_{Li} \\ Y_{Li} \end{pmatrix} + \begin{pmatrix} dx+\Delta dx \\ dy+\Delta dy \end{pmatrix}$$

After this operation, the wafer stage is moved on the basis of the corrected coordinates $(X_{TiF}, Y_{TiF})$ of the calculated alignment mark, and the resist formed on the first pattern is optically exposed by applying reticle having the second pattern formed thereon.

In the [Step-150], the wording of "repeated by a plurality of times" is meant by not only a repetition of the [step-120] to the [step-140] by a predetermined number of times but also includes the case in which a repetition of the [step-120] to the [step-140] is performed until the residual sum of squares takes an approximate minimum value or becomes 0. That is, in the case that the value of $\Sigma E_{Xii}^2 + \Sigma E_{Yii}^2$ calculated at present time becomes smaller than the value of $\Sigma E_{Xii}^2 + \Sigma E_{Yii}^2$ calculated in the previous step, it includes a technical concept that the [step-120] to the [step-140] are repeated and the [step-120] to the [step-140] are repeated until the residual sum of squares $\Sigma E_{Xii}^2 + \Sigma E_{Yii}^2$ takes an approximate minimum value or becomes 0. The approximate minimum value defined in this case is meant by a minimum value obtained in a combination of all given variables (dx, dy, θ, α, $S_X$, $S_Y$). More practically, it is satisfactory that the minimum value of the residual sum of squares $\Sigma E_{Xii}^2 + \Sigma E_{Yii}^2$ finally obtained is sufficiently improved as compared with a local minimum value which is most approximate to the initial value and further the minimum value of $\Sigma E_{Xii}^2 + \Sigma E_{Yii}^2$ finally obtained by itself can be sufficiently attained.

In the case that the residual sum of squares $R_1$ calculated in the [step-140] is the same as or rather than the residual sum of squares $R_0$ and that the residual sum of squares $R_1$ is smaller than the residual sum of squares $R_0$ under application of the original alignment correction coefficients dx, dy, θ, α, $S_X$, $S_Y$ not added with the random number elements Δdx, Δdy, Δθ, Δα, $\Delta S_X$, $\Delta S_Y$, the [step-120] to [step-140] may be repeated by a plurality of times with the alignment correction coefficients dx, dy, θ, α, $S_X$, $S_Y$ added with the random number elements dx, Δdy, Δθ, Δα, $\Delta S_X$, $\Delta S_Y$, being applied as new alignment correction coefficients dx, dy, θ, α, $S_X$, $S_Y$.

Figure 8:
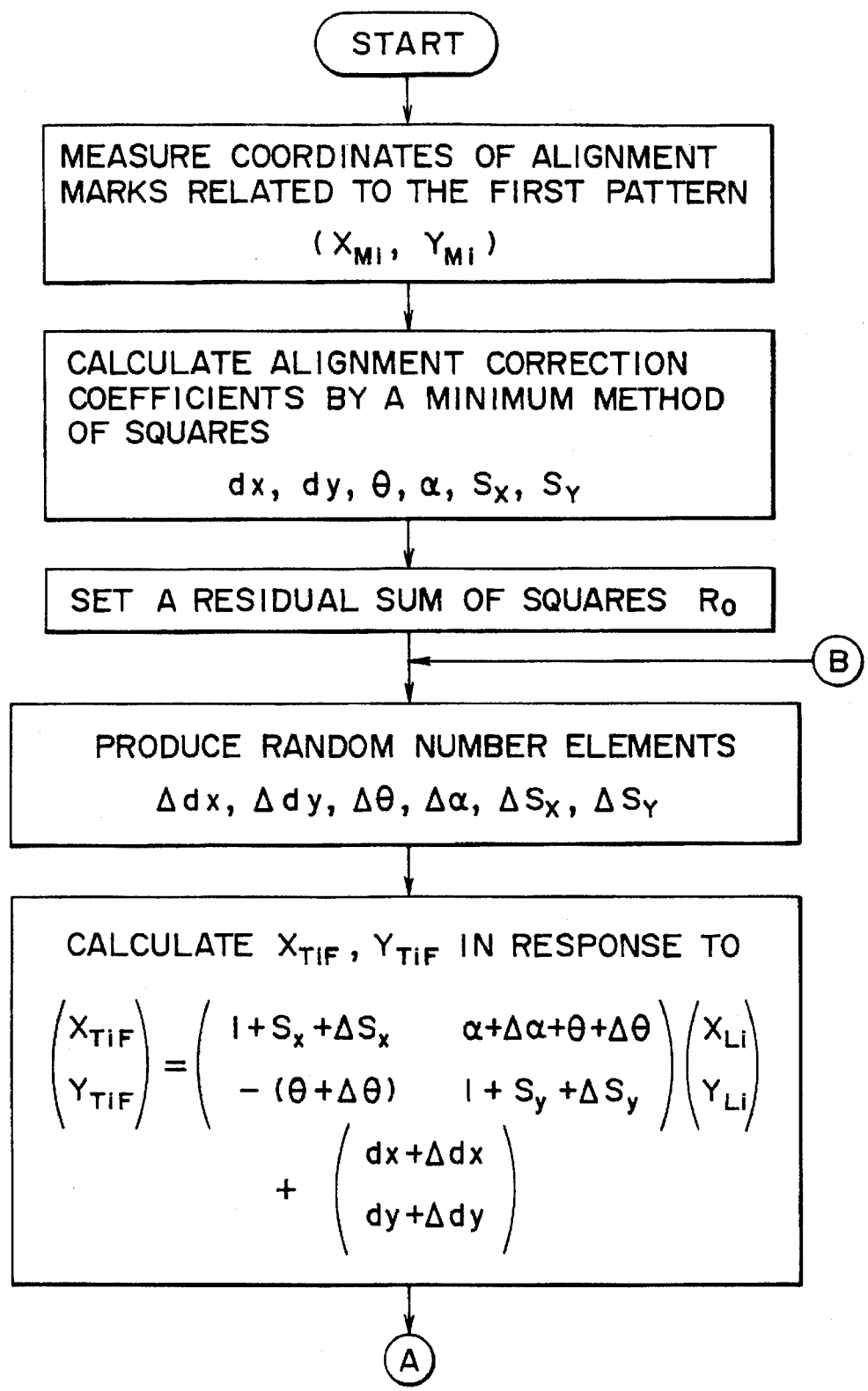
FIG. 8 is a flowchart for showing each of the steps in a modified alignment method of the second preferred embodiment of the present invention.
Figure 9:
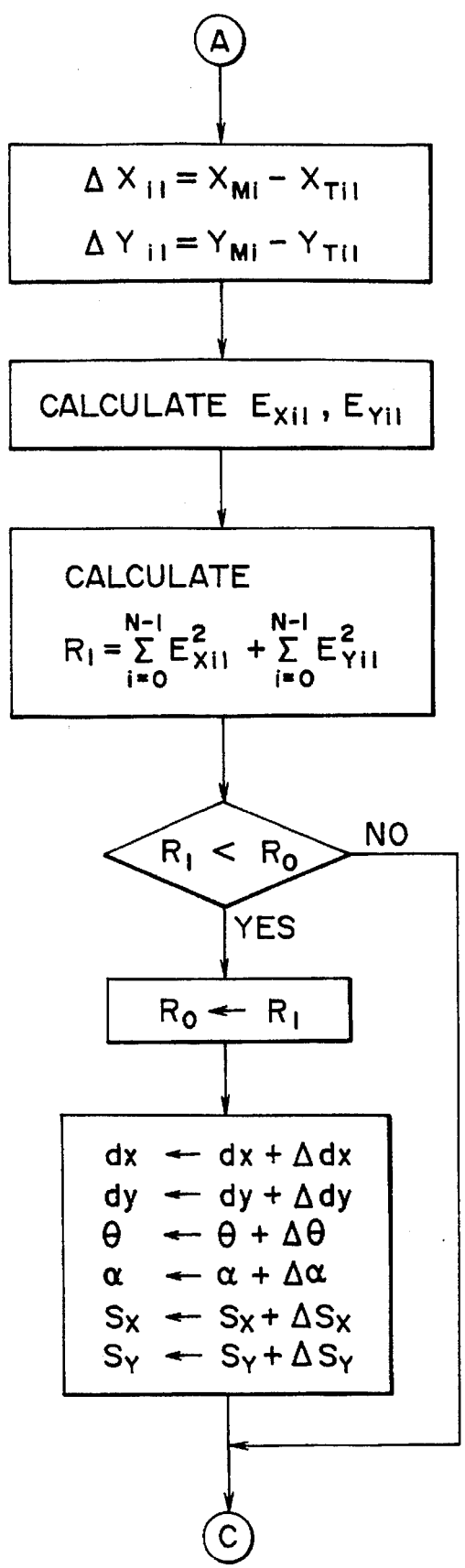
FIG. 9 is a flowchart subsequent to FIG. 8 for showing each of the steps in a modified alignment method in the second preferred embodiment of the present invention.
Figure 10:
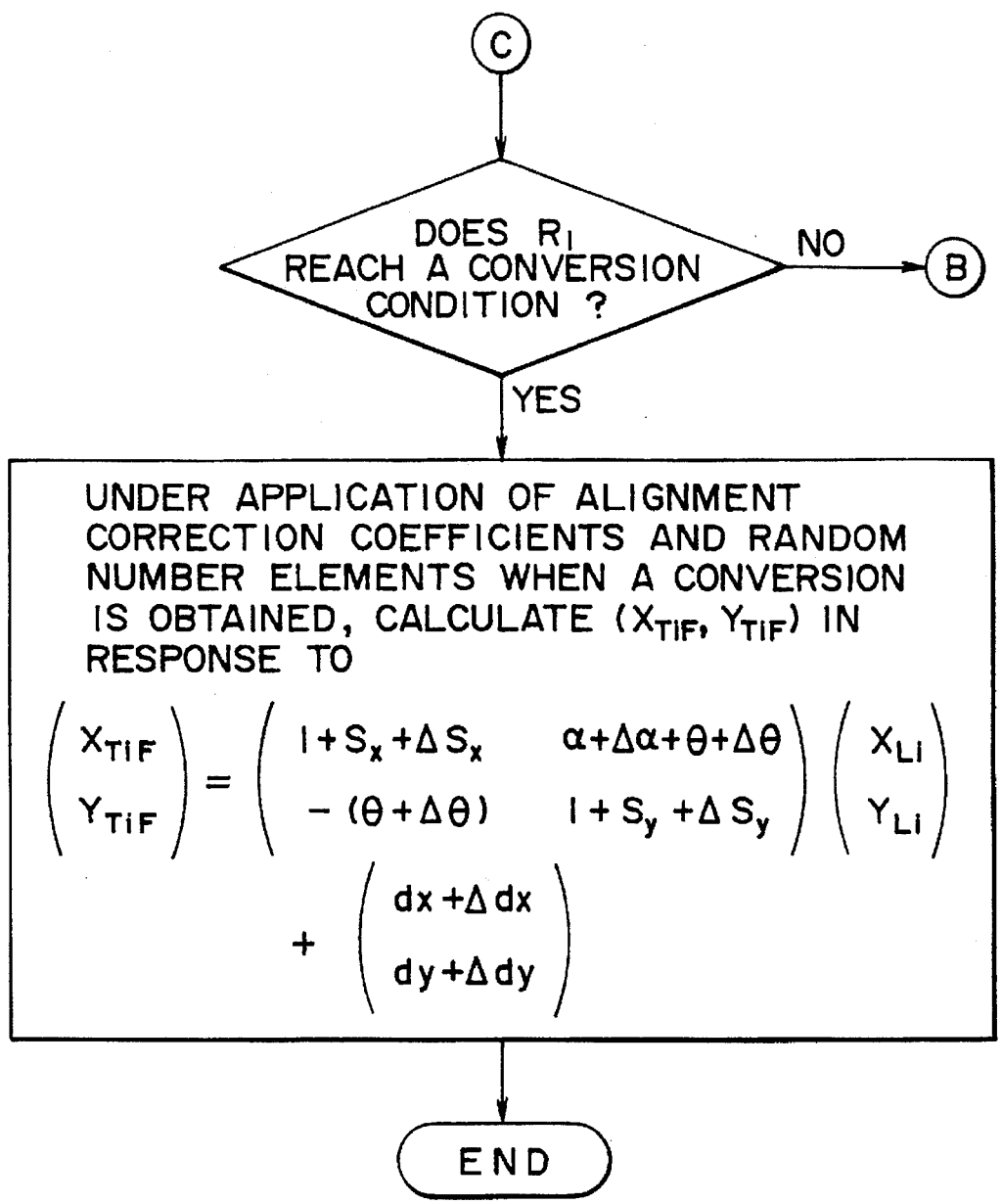
FIG. 10 is a flowchart subsequent to FIG. 8 for showing each of the steps in a modified alignment method in the second preferred embodiment of the present invention.
Figure 11:
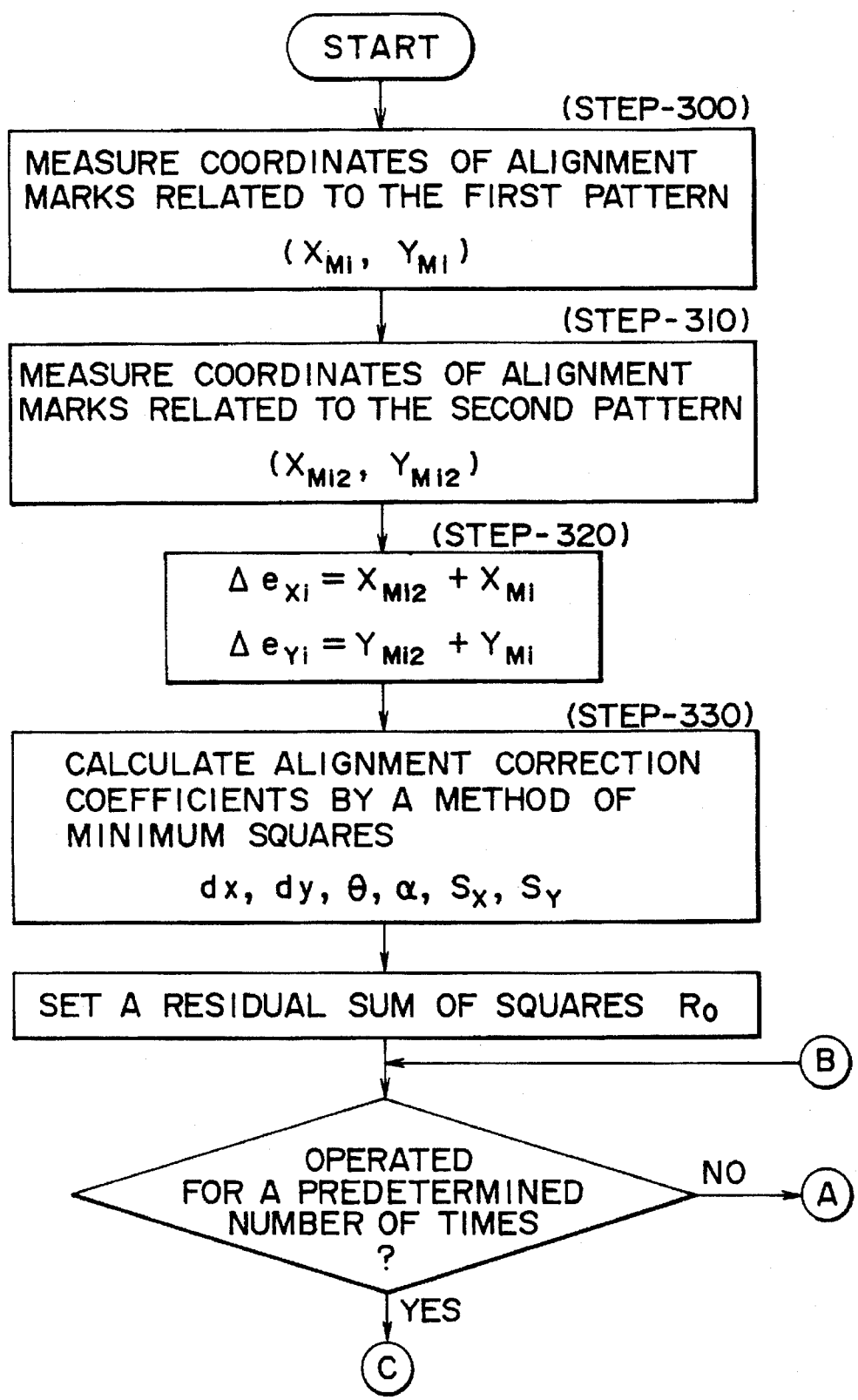
FIG. 11 is a flowchart for showing each of the steps in the alignment method in the third preferred embodiment of the present invention.
Figure 12:
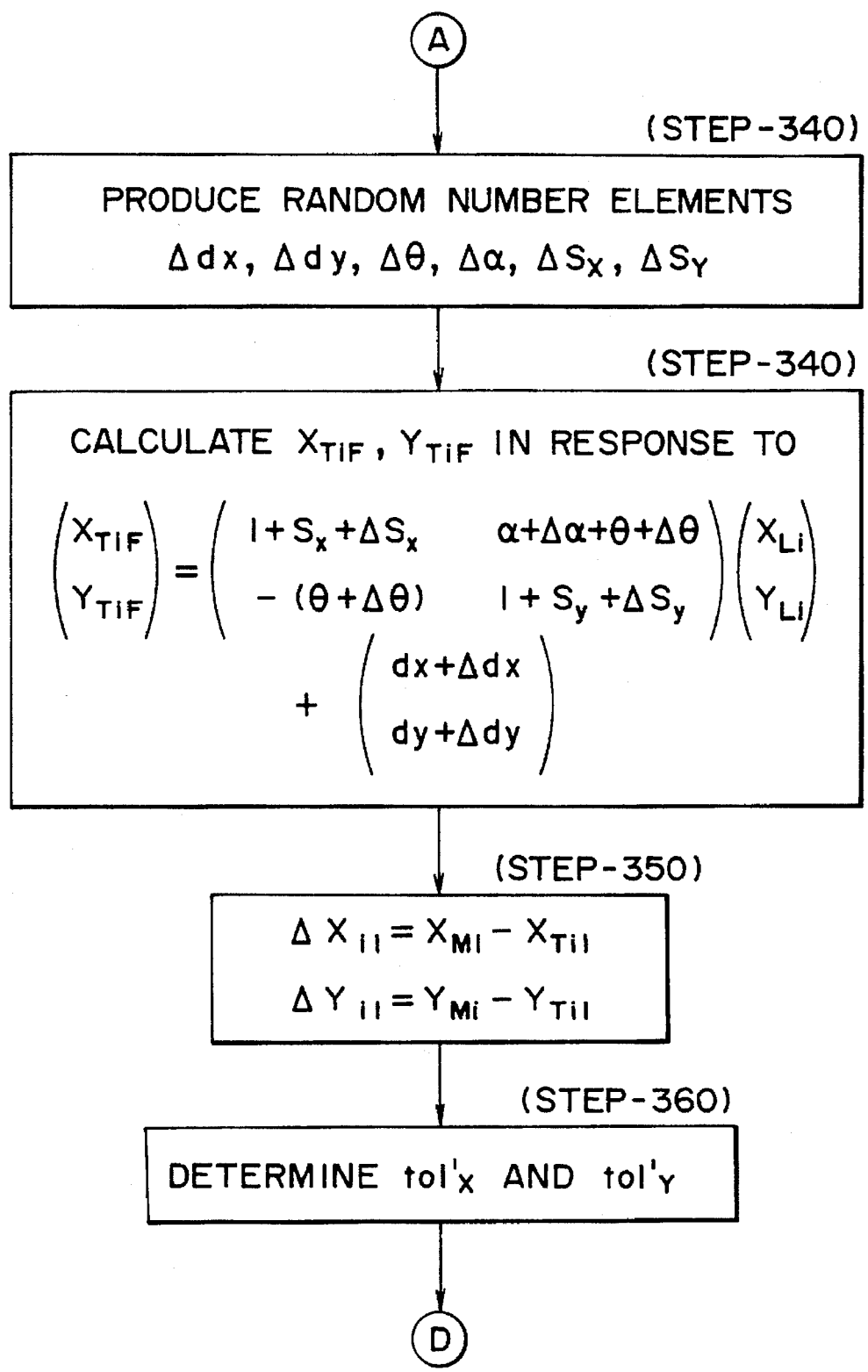
FIG. 12 is a flowchart subsequent to FIG. 11 for showing each of the steps in the alignment method in the third preferred embodiment of the present invention.
Figure 13:
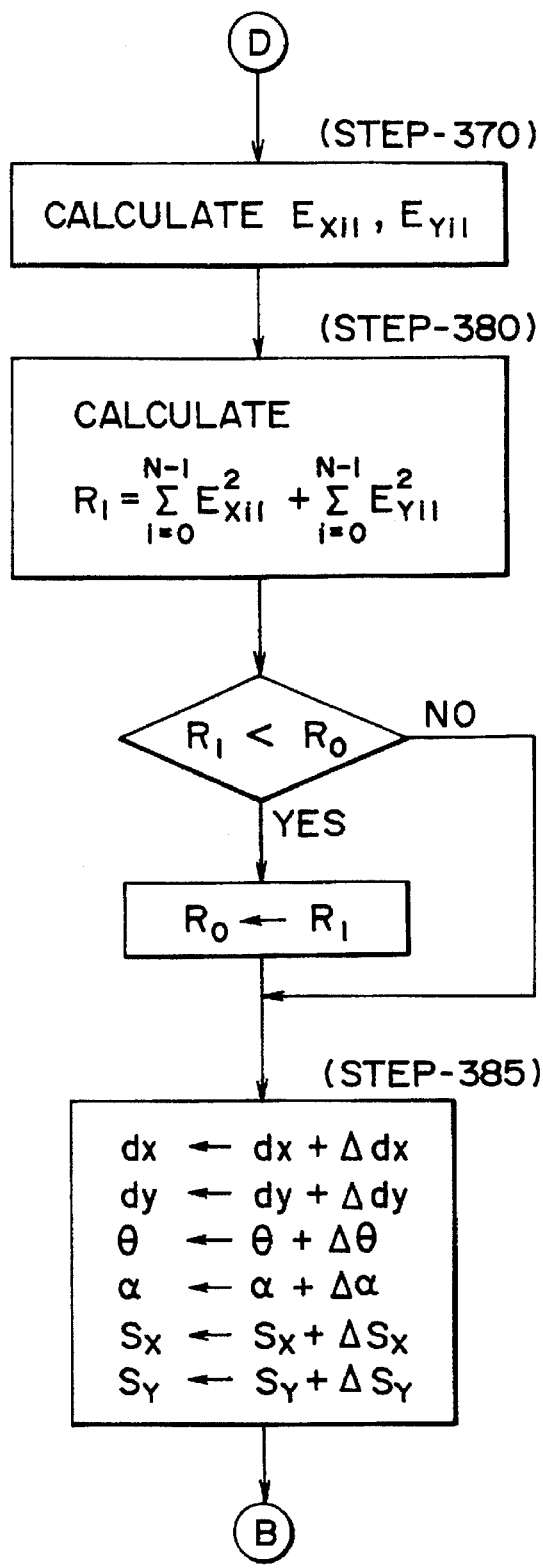
FIG. 13 is a flowchart subsequent to FIG. 12 for showing each of the steps in the alignment method in the third preferred embodiment of the present invention.
Figure 14:
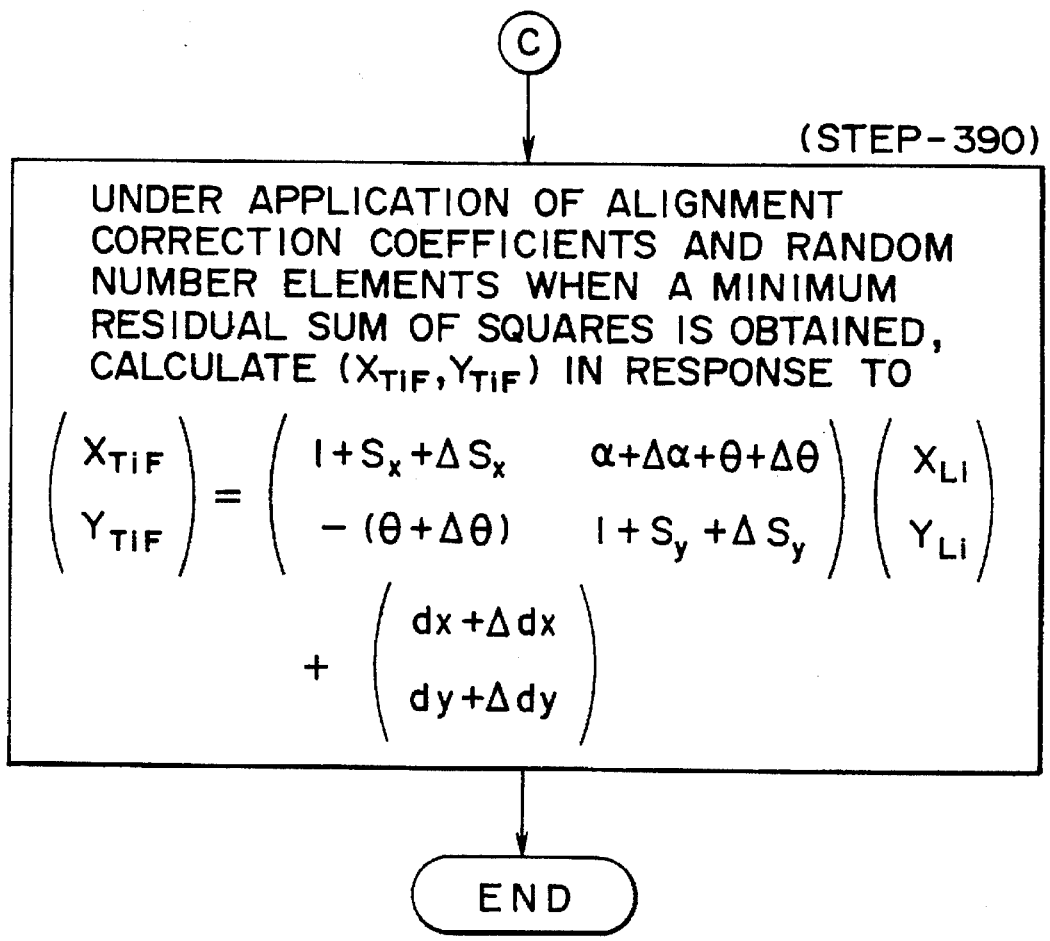
FIG. 14 is a flowchart subsequent to FIG. 13 for showing each of the steps of the alignment method of the third preferred embodiment of the present invention.

In FIGS. 8 to 10 are shown flowcharts of a second preferred embodiment of the present invention, i.e. the modified form of the first alignment method.

The pattern to be formed is remarkably deformed from its design pattern in the case that the pattern in a semiconductor device under an application of a reducing optical system is formed, in particular, when its forming pattern has approximately a limited resolution degree of the reducing optical system.

Figure 15A:
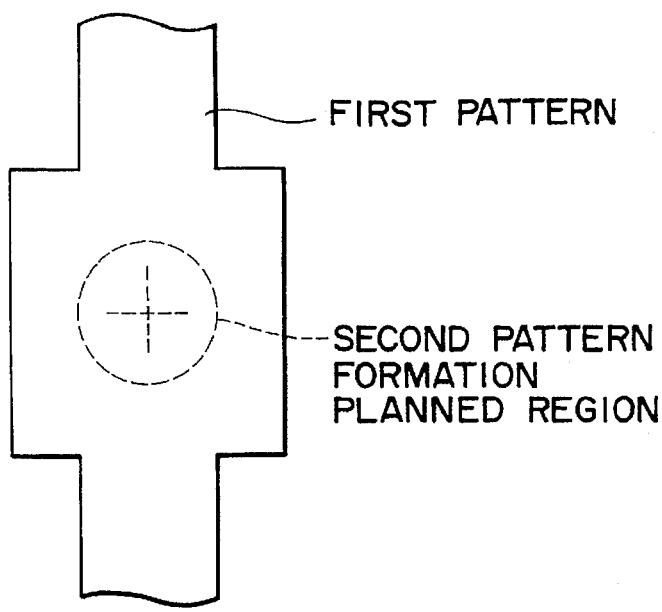
FIGS. 15A and 15B are views for showing technical concepts of $\Delta X_{il}$, $\Delta Y_{il}$, $tol_X$, $tol_Y$ and residuals $E_{Xil}$, $E_{Yil}$ in the alignment method of the first preferred embodiment of the present invention.
Figure 15B:
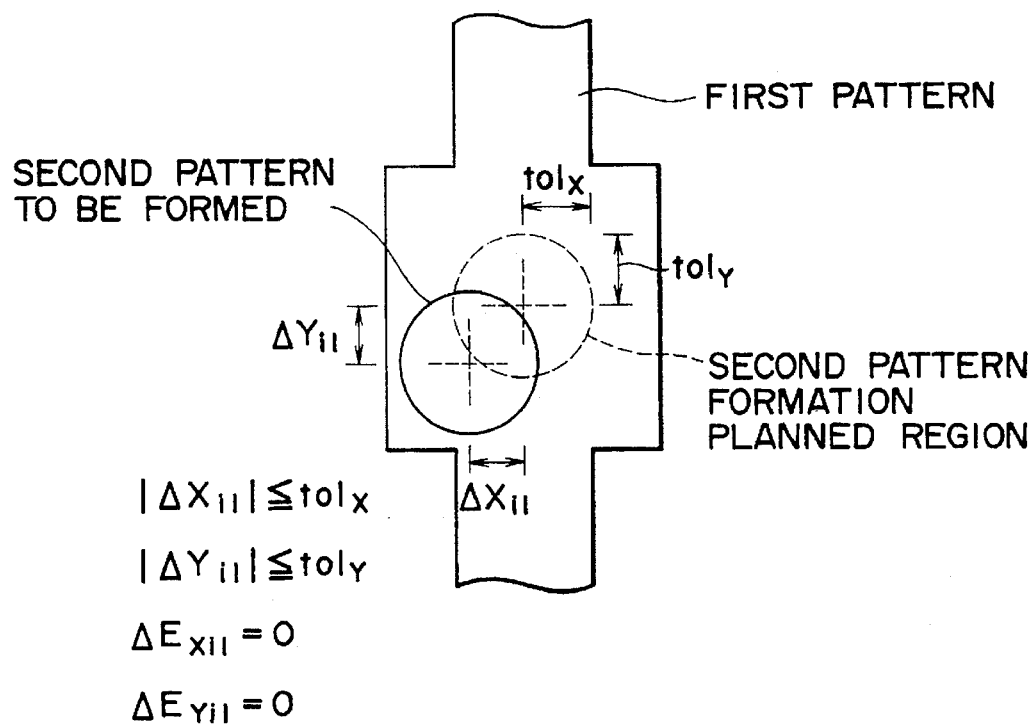
Figure 18:
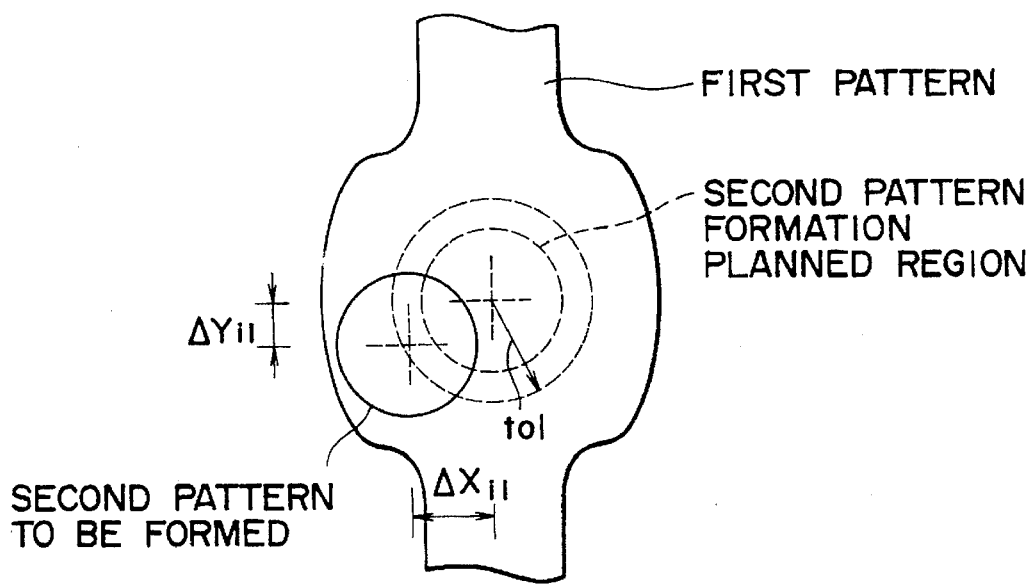
FIG. 18 is a schematic illustration of the first pattern and the like formed near a limited resolution degree in a reducing optical system.

For example, even in case of the pattern to be designed in reference to the alignment displacement as shown in FIG. 15, the first pattern is of a deformed one differing from that of the first pattern as shown in FIG. 18 near a limited resolution degree in the reducing optical system to be used. In this case, the alignment displacement tolerance for forming the normal second pattern (for example, a contact hole pattern) is defined as $$\Delta X^2 + \Delta Y^2 < tol^2 = tol_X^2 + tol_Y^2$$

Accordingly, the evaluation of the alignment displacement in this case modifies the residuals $E_{Xii}$, $E_{Yii}$ in each of the alignment marks in the [step-130] concerning the first preferred embodiment of the present invention and determine them in accordance with the following rule.

(A') In the case that $\Delta X_{ii}^2 + \Delta Y_{ii}^2 \leq tol_X^2 + tol_Y^2 = tol^2$ $$E_{Xii} = 0$$

$$E_{Yii} = 0$$

(B') In the case that $\Delta X_{ii}^2 + \Delta Y_{ii}^2 > tol_X^2 + tol_Y^2 = tol^2$ $$E_{Xii}^2 + E_{Yii}^2 = \Delta X_{ii}^2 + \Delta Y_{ii}^2 - (tol_X^2 + tol_Y^2)$$

Unless otherwise specified, since the alignment method of the second preferred embodiment of the present invention can be set to be similar to the alignment method of the first preferred embodiment of the present invention, its detailed description will be eliminated. As described above, it is satisfactory that the alignment correction coefficients dx, dy, θ, α, $S_X$, $S_Y$ are set to be optimal in such a way that the residual sum of squares of the alignment displacement is made to be minimum with the case of the aforesaid (B') being applied as the alignment displacement.

In the practical manufacturing process for a semiconductor device, a displacement from a design pattern may easily be generated due to various causes. In view of this fact, it is preferable that the alignment displacement tolerance values in the present invention can be set for each of the regions every time on the basis of the pattern shape of the first pattern actually formed.

The third preferred embodiment of the present invention will be described.

There occurs sometimes that the first pattern and the second pattern are already formed and then the third pattern is formed concurrently in respect to these first and second patterns. In such a case as above, it is necessary to set the alignment displacement tolerances in view of the alignment displacement amount between the lower layer patterns (between the first pattern and the second pattern) formed prior to the formation of the third pattern. As shown in FIGS. 19 and 20, it is assumed that the alignment is carried out in order to form the two contact holes which are the third pattern in respect to the first pattern and the second pattern.

The alignment method of the third preferred embodiment of the present invention is defined as an alignment method in an optical exposing method for a semiconductor device in which a resist is formed on the first pattern and the second pattern formed on the wafer and then the resist is optically exposed to form the third pattern on the resist, wherein a position where the third pattern against the first pattern and the second pattern is determined on the basis of a measurement of positions of the number of N of the alignment marks associated with the first pattern formed on the wafer.

That is, at first, the alignment for the second pattern is carried out for the first pattern so as to form the second pattern. Then, in the case that alignment is carried out for the first pattern so as to form the third pattern (for example, a contact hole pattern), the alignment method of the third preferred embodiment of the present invention is applied. Referring now to the flow charts shown in FIGS. 11 to 14, the alignment method of the third preferred embodiment of the present invention will be described.

[Step-300]

At first, positions of the alignment marks of the number of N associated with the first pattern are measured and then the coordinates $(X_{Mi}, Y_{Mi})$ (where, i=0, 1, 2, ..., N−1) of each of the alignment marks is calculated in reference to the result of measurement.

[Step-310]

In turn, positions of the alignment marks of the number of N associated with the second pattern are measured and then the coordinates $(X_{Mi2}, Y_{Mi2})$ of each of the alignment marks is calculated in reference to the result of measurement.

The measurement of these alignment marks can be carried out by applying an alignment mark sensing system of TTL on-axis method, an alignment mark sensing system of TTL off-axis method and an alignment mark sensing system of an off-axis method, respectively.

[Step-320]

Alignment displacement amounts $\Delta e_{xi}$, $\Delta e_{yi}$ in each of the alignment marks are calculated in reference to the following equations (6-1) and (6-2), respectively.

$$\Delta e_{xi} = X_{Mi2} - X_{Mi} \quad \text{Equation (6-1)}$$

$$\Delta e_{yi} = Y_{Mi2} - Y_{Mi} \quad \text{Equation (6-2)}$$

[Step-330]

Then, under an assumption that the offsets of error of the alignment marks associated with the first pattern in the directions X and Y are defined as dx, dy; a rotation of an error in the alignment mark associated with the first pattern in its rotating direction is defined as θ; an orthogonal degree of layout of an error in an orthogonal degree at the layout of each of the alignment marks associated with the first pattern is defined as α; and scalings of variation in magnification of the alignment marks associated with the first pattern in the directions are defined as $S_X$, $S_Y$, the alignment correction coefficients dx, dy, θ, α, $S_X$, $S_Y$ are calculated by a method of least squares on the basis of the following equations (1) and (2) in reference to the coordinates $(X_{Mi}, Y_{Mi})$ of each of the alignment marks associated with the first pattern and the coordinates $(X_{Li}, Y_{Li})$ of the rational grid point corresponding to each of the alignment marks. This step is similar to the related art alignment method.

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Ni}X_{Li} \\ \sum_{i=0}^{N-1} X_{Ni}Y_{Li} \\ \sum_{i=0}^{N-1} X_{Ni} \end{pmatrix} \quad \text{Equation (1)}$$

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} Y_{Ni}X_{Li} \\ \sum_{i=0}^{N-1} Y_{Ni}Y_{Li} \\ \sum_{i=0}^{N-1} Y_{Ni} \end{pmatrix} \quad \text{Equation (2)}$$

where $a = 1 + S_X$
$b = \alpha + \theta$
$c = dx$
$d = -\theta$
$e = 1 + S_Y$
$f = dy$ The technical concept of these alignment correction coefficients dx, dy, θ, α, $S_X$, $S_Y$ is as shown in FIGS. 3 and 4. In addition, these alignment correction coefficients dx, dy, θ, α, $S_X$, $S_Y$ are applied as the initial values in the following steps.

A proper value is set in advance as the residual sum of squares $R_0$ to be used in the following steps.

[Step-340]

Then, random number elements Δdx, Δdy, Δθ, Δα, $\Delta S_X$, $\Delta S_Y$ associated with each of the alignment correction coefficients dx, dy, θ, α, $S_X$, $S_Y$ are generated. Then, the correction coordinates $(X_{Til}, Y_{Til})$ of the alignment mark are calculated in reference to the following equation (3) on the basis of the alignment correction coefficients dx, dy, θ, α, $S_X$, $S_Y$ and each of the random number elements Δdx, Δdy, Δθ, Δα, $\Delta S_X$, $\Delta S_Y$. Each of the random number elements is a normal random number.

$$\begin{pmatrix} X_{Til} \\ Y_{Til} \end{pmatrix} = \begin{pmatrix} 1 + S_x + \Delta S_x & \alpha + \Delta\alpha + \theta + \Delta\theta \\ -(\theta + \Delta\theta) & 1 + S_y + \Delta S_y \end{pmatrix} \begin{pmatrix} X_{Li} \\ Y_{Li} \end{pmatrix} + \begin{pmatrix} dx + \Delta dx \\ dy + \Delta dy \end{pmatrix} \quad \text{Equation (3)}$$

Then, $\Delta X_{il} = X_{Mi} - X_{Til}$ $\Delta Y_{il} = Y_{Mi} - Y_{Til}$ are calculated.

[Step-360]

Then, alignment displacement tolerance values $tol_X'$ and $tol_Y'$ in the new directions X and Y are determined in accordance with the following rule on the basis of the alignment displacement tolerances $tol_X$, $tol_Y$ set for each of the directions X, Y which are alignment displacement values allowable in design of a semiconductor device, alignment displacement amounts $\Delta e_{xi}$, $\Delta e_{yi}$ calculated at the [step-320] and $\Delta X_{il}$, $\Delta Y_{il}$ calculated at the [step-350]. Provided that when the values of $tol_X'$ and $tol_Y'$ are negative, they are assumed to be 0.

In the case that (x-1)$\Delta e_{xi} \geq 0$ and $\Delta X_{io} \geq 0$:
$tol_X' = tol_X$ In the case that (x-2)$\Delta e_{xi} \geq 0$ and $\Delta X_{io} < 0$:
$tol_X' = tol_X - |\Delta e_{xi}|$ In the case that (x-3)$\Delta e_{xi} < 0$ and $\Delta X_{io} \geq 0$:
$tol_X' = tol_X - |\Delta e_{xi}|$ In the case that (x-4)$\Delta e_{xi} < 0$ and $\Delta X_{io} < 0$:
$tol_X' = tol_X$ In the case that (y-1)$\Delta e_{yi} \geq 0$ and $\Delta Y_{io} \geq 0$:
$tol_Y' = tol_Y$ In the case that (y-2)$\Delta e_{yi} \geq 0$ and $\Delta Y_{io} < 0$:
$tol_Y' = tol_Y - |\Delta e_{yi}|$ In the case that (y-3)$\Delta e_{yi} < 0$ and $\Delta Y_{io} \geq 0$:
$tol_Y' = tol_Y - |\Delta e_{yi}|$ In the case that (y-4)$\Delta e_{yi} < 0$ and $\Delta Y_{io} < 0$:
$tol_Y' = tol_Y$

[Step-370]

The residuals $E_{Xii}$, $E_{Yii}$ at each of the alignment marks associated with the first pattern are determined in accordance with the following rule on the basis of $tol_x'$ and $tol_y'$.

(A) In the case that $|\Delta X_{il}| \leq tol_x'$ and $|\Delta Y_{il}| \leq tol_y'$ $$E_{Xii}=0$$

$$E_{Yii}=0$$

That is, the alignment displacements within the set alignment displacement tolerances are assumed to be 0 and they are equally treated. Because, there is no problem in view of the actual structure of the semiconductor device even if whatever type of pattern positional displacement may occur within the alignment displacement tolerances. In other words, $tol_x$, $tol_y$ are set in such a manner that there occurs no problem in view of a structure of a semiconductor device whatever pattern positional displacement may occur within the alignment displacement tolerances.

(B) In the case that $|\Delta X_{il}| > tol_x'$ and $|\Delta Y_{il}| > tol_y'$:

$$E_{Xii}=|\Delta X_{il}|-tol_x'$$

$$E_{Yii}=|\Delta Y_{il}|-tol_y'$$

That is, the alignment displacement value exceeding the alignment displacement tolerance values ($tol_x'$, $tol_y'$) is defined as an alignment displacement.

(C) In the case that $|\Delta X_{il}| \leq tol_x'$ and $|\Delta Y_{il}| > tol_y'$:

$$E_{Xii}=0$$

$$E_{Yii}=|\Delta Y_{il}|-tol_y'$$

(D) In the case that $|\Delta X_{il}| > tol_x'$ and $|\Delta Y_{il}| \leq tol_y'$:

$$E_{Xii}=|\Delta X_{il}|-tol_x'$$

$$E_{Yii}=0$$

More practically, as shown in FIG. 19, it is assumed that there occurs an alignment only by $\Delta e_{Xi}$ in respect to the direction X when the second pattern is formed. That is, $$\Delta e_{Xi}=X_{Mi2}-X_{Mi}$$

where, $X_{Mi2}$ is an X coordinate of a position of the alignment mark associated with the second pattern, and $X_{Mi}$ is an X coordinate of a position of the alignment mark associated with the first pattern. The alignment displacement tolerance value for satisfying a necessary condition (a necessary condition for forming a normal third pattern) for forming a semiconductor device is reduced only by $|\Delta e_{Xi}|$ in respect to a minus direction of $\Delta X_{il}(=X_{Mi}-X_{Til})$ due to this alignment displacement.

That is, in the case that $\Delta e_{Xi} \geq 0$ and $\Delta X_{il} \geq 0$, $$tol_x'=tol_x$$

and in turn, in the case that $\Delta e_{Xi} \geq 0$ and $\Delta X_{il} < 0$, $$tol_x'=tol_x-|\Delta e_{Xi}|$$

becomes a new alignment displacement tolerance value.

In turn, as shown in FIG. 20, it is assumed that the alignment displacement occurs only by $-\Delta e_{Xi}$ in respect to the direction X when the second pattern is formed. The alignment displacement tolerance value for satisfying a necessary condition (a necessary condition for forming a normal third pattern) required in formation of a semiconductor device is reduced only by $|\Delta e_{Xi}|$ in regard to the plus direction of $\Delta X_{il}(=X_{Mi}-X_{Til})$ due to this alignment displacement.

That is, in the case that $\Delta e_{Xi} < 0$ and $\Delta X_{il} < 0$, $$tol_x'=tol_x$$

and in turn, in the case that $\alpha e_{Xi} < 0$ and $\Delta X_{il} \geq 0$, $$tol_x'=tol_x-|\Delta e_{Xi}|$$

becomes a new alignment displacement tolerance value.

Then, it is satisfactory that the alignment correction coefficients dx, dy, $\theta$, $\alpha$, $S_X$, $S_Y$ are made to become the most optimal values in such a way that the residual sum of squares of the alignment displacement is made to be minimum with this new alignment displacement tolerance being applied as an alignment displacement.

Even in the case that an alignment displacement is generated only by $\Delta e_{Yi}$ in the direction Y when the second pattern is formed, it is satisfactory that this may be processed in the same manner as that of the aforesaid process.

[Step-380]

The residual sum of squares $R_1$ is calculated in accordance with the following equation (4) in reference to these residuals $E_{Xii}$, $E_{Yii}$ and when the calculated residual sum of squares $R_1$ is smaller than the residual sum of squares $R_0$, $R_1$ is set to be a new $R_0$.

$$R_1 = \sum_{i=0}^{N-1} E_{Xii}^2 + \sum_{i=0}^{N-1} E_{Yii}^2 \qquad \text{Equation (4)}$$

[Step-385]

The [step-340] to [step-380] are repeated by a plurality of times with the alignment correction coefficients dx, dy, $\theta$, $\alpha$, $S_X$, $S_Y$ added with the random number elements $\Delta dx$, $\Delta dy$, $\Delta\theta$, $\Delta\alpha$, $\Delta S_X$, $\Delta S_Y$ being applied as new alignment correction coefficients dx, dy, $\theta$, $\alpha$, $S_X$, $S_Y$. That is, the [step-340] to [step-380] are repeated by a plurality of times with each of dx+$\Delta$dx, dy+$\Delta$dy, $\theta$+$\Delta\theta$, $\alpha$+$\Delta\alpha$, $S_X$+$\Delta S_X$, $S_Y$+$\Delta S_Y$ being applied as new alignment correction coefficients dx, dy, $\theta$, $\alpha$, $S_X$, $S_Y$. The technical concept of repeating processing by a plurality of times is similar to that already described in reference to the alignment method in the first preferred embodiment of the present invention.

Similarly to the case in which a modified form of alignment method in the first preferred embodiment has already been described, in the case that the residual sum of squares $R_1$ calculated at the [step-380] is the same or larger than the residual sum of squares $R_0$, the original alignment correction coefficients dx, dy, $\theta$, $\alpha$, $S_X$, $S_Y$ not added with the random number elements $\Delta dx$, $\Delta dy$, $\Delta\theta$, $\Delta\alpha$, $\Delta S_X$, $\Delta S_Y$ are applied and in turn in the case that the residual sum of squares $R_1$ is smaller than the residual sum of squares $R_0$, the [step-340] to [step-380] can also be performed for a plurality of times with the alignment correction coefficients dx, dy, $\theta$, $\alpha$, $S_X$, $S_Y$ added by the random number elements $\Delta dx$, $\Delta dy$, $\Delta\theta$, $\Delta\alpha$, $\Delta S_X$, $\Delta S_Y$ being applied as new alignment correction coefficients dx, dy, $\theta$, $\alpha$, $S_X$, $S_Y$.

[Step-390]

Then, the corrected coordinates ($X_{TiF}$, $Y_{TiF}$) of alignment mark associated with the first pattern for optically exposing the third pattern are calculated by the following equation (5) on the basis of the alignment correction coefficients dx, dy, $\theta$, $\alpha$, $S_X$, $S_Y$ and each of the random number elements $\Delta dx$, $\Delta dy$, $\Delta\theta$, $\Delta\alpha$, $\alpha S_X$, $\Delta S_Y$ when the minimum residual sum of squares $R_1$ is attained.

$$\begin{pmatrix} X_{TiF} \\ Y_{TiF} \end{pmatrix} = \begin{pmatrix} 1+S_x+\Delta S_x & \alpha+\Delta\alpha+\theta+\Delta\theta \\ -(\theta+\Delta\theta) & 1+S_y+\Delta S_y \end{pmatrix} \begin{pmatrix} X_{Li} \\ Y_{Li} \end{pmatrix} + \begin{pmatrix} dx+\Delta dx \\ dy+\Delta dy \end{pmatrix}$$ Equation (5)

Then, a fourth preferred embodiment of the present invention will be described.

In the case that when a pattern in a semiconductor device is formed by applying an optical size reducing system, in particular, its forming pattern size is approximate to a limited resolution degree of the optical size reducing system, the pattern to be formed is remarkably deformed from its design pattern. Accordingly, even in the alignment method of the third preferred embodiment of the present invention, the alignment displacement tolerance values required in design of the semiconductor device must be set more rationally in response to the pattern shape to be actually formed.

In the alignment method according to the fourth preferred embodiment of the present invention, the residuals $E_{Xii}$, $E_{Yii}$ of each of the alignment marks in the [step-370] of the alignment method of the third preferred embodiment are determined by being modified into the following rule. In addition, except this point, since the alignment method of the fourth preferred embodiment of the present invention can be similar to the alignment method of the third preferred embodiment, its detailed description will be eliminated.

(A') In the case that $\Delta X_{ii}^2 + \Delta Y_{ii}^2 \leq tol_x'^2 + tol_y'^2 = tol^2$:

$E_{Xii}=0$ $E_{Yii}=0$ (B') In the case that $\Delta X_{ii}^2 + \Delta Y_{ii}^2 > tol_x'^2 + tol_y'^2 = tol^2$:

$E_{Xii}^2 + E_{Yii}^2 = \Delta X_{ii}^2 + \Delta Y_{ii}^2 - (tol_x'^2 + tol_y'^2)$ In the actual manufacturing process for a semiconductor device, a displacement from the design pattern may easily be generated due to various causes. In view of this fact, also in the alignment method of the fourth preferred embodiment of the present invention, it is desirable that the alignment displacement tolerance values are set every time for each of the regions in reference to the pattern shape of the pattern actually formed.

An example of experiment of the present invention will be indicated.

A practical example under application of the alignment method of the first preferred embodiment of the present invention will be described. Alignment conditions are set as follows.

| Wafer size: | 8 inches |
|---|---|
| Step pitch (chip size): | 20000 μm |
| Number of shots: | 9 × 9 (81) |
| Alignment mark sampling: | 81 locations |

At first, in FIG. 21 is shown a frequency distribution figure of displacement (residual) between the positional coordinates $(X_{Mi}, Y_{Mi})$ of the measured data of the alignment mark of the first pattern (a base pattern) before correction of alignment and the coordinates $(X_{Li}, Y_{Li})$ of the rational grid point corresponding to each of the alignment marks. In this case, their values are as follows.

$X_{ave}=0.060968$ μm
$\sigma_X=0.024363$ μm
$X_{min}=0.015640$ μm
$X_{max}=0.138800$ μm
$Y_{ave}=0.065258$ μm
$\sigma_Y=0.029341$ μm
$Y_{min}=0.024760$ μm
$Y_{max}=0.146200$ μm Feature of these measured data consists in the fact that an alignment displacement distribution is not symmetrical in lateral direction, i.e. is not in accordance with the normal distribution.

In FIG. 22 is shown a frequency distribution figure of a displacement (residual) of the corrected coordinates $(X_{TiF}, Y_{TiF})$ of each of the alignment marks from the coordinates $(X_{Li}, Y_{Li})$ of the rational grid point corresponding to each of the alignment marks in the case that the first pattern as described above is corrected in its alignment with the related art alignment method. In this case, the alignment correction coefficients are made optimal by a method of least squares in such a way that the residual sum of squares may become minimum. The result of the optimal formation of the alignment correction coefficients with the related art alignment method is as follows.

$dx=6.022231\times10^{-2}$ μm
$dy=6.471484\times10^{-2}$ μm
$\theta=5.093068\times10^{-8}$ rad
$\alpha=1.141213\times10^{-7}$ rad
$S_X=3.964432\times10^{-8}$
$S_Y=1.897899\times10^{-7}$ In this case, they showed the following values.

$X_{ave}=0.000746$ μm
$\sigma_X=0.022712$ μm
$X_{min}=-0.028207$ μm
$X_{max}=0.079500$ μm
$Y_{ave}=0.000820$ μm $\sigma_Y=0.027326$ μm
$Y_{min}=-0.036042$ μm
$Y_{max}=0.066302$ μm As apparent from the frequency distribution figure shown in FIG. 22, the maximum and minimum values of the alignment displacement are distributed non-symmetrically. If the alignment displacement tolerance in design is assumed to be ±0.05 μm, the displacement value is 0.04 μm or less at a minus side and the displacement value is up to near 0.08 μm at a plus side. That is, it is apparent that many optical exposing shots become improper. In this way, it is apparent that in the case that the random components in the displacement components in the alignment marks are distributed non-symmetrically, some disadvantages may be generated during a practical manufacturing process of a semiconductor device due to an eccentric presence of displacement of the corrected coordinates of each of the alignment marks irrespective of no presence of problem in view of the specification of the alignment (for example, $|X_{ave}|+3\sigma X$). Non-symmetrical distribution of the corrected coordinates of each of the alignment marks is a phenomenon which may easily and frequently occur in the actual manufacturing process for a semiconductor device and the related art alignment method may not accomplish a satisfactory alignment accuracy.

The alignment process was carried out by the alignment method of the first preferred embodiment of the present invention on the basis of the value of the position measured data of the alignment marks of the first pattern (base pattern)

before the same alignment correction as that of the related art alignment method shown in the frequency distribution figure of FIG. 21. The alignment displacement tolerance values were set as follows.

$tol_x = 0.05$ μm $tol_y = 0.05$ μm

That is, the alignment displacement values $E_{Xit}$, $E_{Yit}$ are set to be 0 within a range of ±0.05 μm of the values $\Delta X_{it}$, $\Delta Y_{it}$. In turn, in the case that they are out of the alignment displacement tolerances $tol_x$, $tol_y$, the displacement value exceeding the alignment displacement tolerances $tol_x$, $tol_y$ is set to be an alignment displacement value. As apparent from FIG. 23, it is possible to limit all the optical exposing shots within the alignment displacement tolerances $tol_x$ and $tol_y$ (0.05 μm). Accordingly, it becomes possible to limit substantial all the optical exposing shots within the standard values by the alignment method of the first preferred embodiment of the present invention. At this time, the most optimal alignment values were as follows.

$dx = 8.522231 \times 10^{-2}$ μm $dy = 7.871484 \times 10^{-2}$ μm $\theta = 5.213068 \times 10^{-8}$ rad $\alpha = 1.141213 \times 10^{-7}$ rad $S_x = 3.974432 \times 10^{-8}$ $S_y = 1.908899 \times 10^{-7}$ In this case, $X_{ave} = -0.024254$ μm $\sigma_X = 0.022712$ μm $X_{min} = -0.053103$ μm $X_{max} = 0.054518$ μm $Y_{ave} = -0.013457$ μm $\sigma_Y = 0.027324$ μm $Y_{min} = -0.050058$ μm $Y_{max} = 0.052214$ μm It is apparent from these values that the related art alignment accuracy judging standards of $|X_{ave}|+3\sigma_X$, $|Y_{ave}|+3\sigma_Y$ are deteriorated irrespective of the fact that the alignment is most rationally attained in view of the design of a semiconductor device.

Prior art alignment: $|X_{ave}|+3\sigma_X = 0.06888$ μm

Alignment of the present invention: $|X_{ave}|+3\sigma_X = 0.09239$ μm

As described above, it can be understood from the practical example of the present invention that the related art alignment method and the judgment standard do not necessarily provide the most optimal condition required in view of the design of the semiconductor device. In turn, application of the alignment method of the present invention enables a more rational and highly accurate alignment which cannot be attained in the related art method.

A second experimental example of experiment of the present invention will be described.

In the second example of experiment of the present invention, a displacement between the positional coordinates $(X_{Mi}, Y_{Mi})$ of the measured data of the alignment marks of the first pattern (base pattern) before alignment correction and the coordinates $(X_{Li}, Y_{Li})$ of the rational grid point corresponding to each of the alignment marks has a distribution approximate to a relative normal distribution.

In such a case as described above, in FIG. 24 is shown a frequency distribution figure of a displacement of the corrected coordinates $(X_{TiF}, Y_{TiF})$ of each of the alignment marks from the coordinates $(X_{Li}, Y_{Li})$ of the rational grid point corresponding to each of the alignment marks when the alignment correction is carried out with the related art alignment method. In this case, the alignment correction coefficients is made to be optimal by a method of least squares in such a way that the residual sum of squares may become minimum. It is apparent from FIG. 24 that the frequency distribution after correction is distributed in approximate symmetrical arrangement around the alignment displacement 0.

In regard to the similar alignment measured data, in FIG. 25 is shown a frequency distribution figure of displacement (residual) of the corrected coordinates $(X_{TiF}, Y_{TiF})$ of each of the alignment marks from the coordinates $(X_{Li}, Y_{Li})$ of the rational grid point corresponding to each of the alignment marks when the alignment correction is carried out with the alignment method of the first preferred embodiment of the present invention. The alignment displacement tolerance values were set to have $tol_x = 0.05$ μm and $tol_y = 0.05$ μm. Although slightly different from these values, the rational alignment correction result similar to that of the alignment method using the related art method of least squares could be attained in such a way that it might be easily understood.

In accordance with the present invention, it is possible to perform a more accurate alignment which could not be accomplished with the related art alignment method. As a result, it is possible to improve yield in a manufacturing step of a VLSI with an ultra fine pattern of 0.35 μm or less, get a high density of and a fine formation of a structure of a semiconductor device under an effective distribution of the alignment displacement tolerance value. The alignment method of the present invention can always provide the most rational high accurate alignment in view of a manufacturing of a semiconductor device without adding any modification to an actual operation in the related art alignment method and without being dependent upon a tendency of the random component of the positional measured values in alignment.

What is claimed is:

1. An alignment method for determining a position where a second pattern in respect to a first pattern is to be formed on the basis of measurement of positions of alignment marks of the number of N associated with the first pattern formed on a substrate comprising the steps of:

(a) measuring the positions of the alignment marks of the number of N associated with the first pattern and calculating the coordinates of each of the alignment marks in reference to a result of such measurement;

(b) calculating each of the errors in the directions X and Y of the alignment marks, errors in rotational directions of the alignment marks, errors of an orthogonal degree of alignment marks, and errors of magnification in the directions X and Y of the alignment marks;

(c) calculating an initial value for getting an alignment correction coefficient under application of a method of least squares in reference to the coordinates of each of the alignment marks and the coordinates of the rational grid corresponding to each of said alignment marks on the basis of each of said errors;

(d) calculating correction coordinates of the alignment marks under application of said initial values;

(e) calculating a difference between each of the alignment coordinates and said corrected coordinates, setting a residual to 0 when the alignment is within a reference region and calculating a residual with said difference from the alignment tolerance value other than 0;

(f) calculating a sum of squares from said residual; and (g) calculating corrected coordinates with a value of said sum of squares being within a reference value.

2. An alignment method according to claim 1 in which the correction coefficients of said corrected coordinates are calculated by repeating said steps (e) to (g) by a plurality of times.

3. An alignment method according to claim 1 in which the correction coefficients of said corrected coordinates are calculated under application of random number elements.

4. An alignment method according to claim 3 in which the residuals $E_{Xil}$, $E_{Yil}$ in each of the alignment marks associated with the first pattern in said step (e) are changed and determined in accordance with the following rule, (A') In the case that $\Delta X_{il}^2 + \Delta Y_{il}^2 \leq tol_X^2 + tol_Y^2$ $$E_{Xil}=0$$

$$E_{Yil}=0$$

(B') In the case that $\Delta X_{il}^2 + \Delta Y_{il}^2 > tol_X^2 + tol_Y^2$ $$E_{Xil}^2 + E_{Yil}^2 = \Delta X_{il}^2 + \Delta Y_{il}^2 - (tol_X'^2 + tol_Y'^2).$$

5. An alignment method according to claim 1 in which said residuals are calculated in reference to a shape of an actual lower layer pattern.

6. An alignment method according to claim 5 in which the residuals are calculated with said actual lower layer pattern being a substantial circular shape.

7. An alignment method for determining a position where a second pattern in respect to a first pattern is to be formed on the basis of measurement of positions of alignment marks of the number of N associated with the first pattern formed on a substrate comprising the steps of:

(a) measuring the positions of the alignment marks of the number of N associated with the first pattern and calculating the coordinates $(X_{Mi}, Y_{Mi})$ (where, i=0, 1, 2, ... N−1) of each of the alignment marks in reference to a result of such measurement;

(b) under an assumption that offsets of errors in the directions X and Y of the alignment marks are defined as dx, dy, a rotation angle of an error in a rotating direction of the alignment marks is defined as θ, an orthogonal degree of layout which is an error of orthogonal degree of layout in each of the alignment marks is defined as α, and scalings which are variation in magnification of the alignment marks in their directions X and Y are defined as $S_X$, $S_Y$, calculating initial values dx, dy, θ, α, $S_X$, $S_Y$ for getting the alignment correction coefficients by a method of least squares in reference to the following equation (1) and the equation (2) on the basis of the coordinates $(X_{Mi}, Y_{Mi})$ of each of the alignment marks and the coordinates $(X_{Li}, Y_{Li})$ of the rational grid point corresponding to each of the alignment marks, $$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (1)}$$

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (2)}$$

$a = 1 + S_X$
$b = \alpha + \theta$
$c = dx$
$d = -\theta$
$e = 1 + S_Y$
$f = dy$ (c) calculating the corrected coordinates $(X_{Til}, Y_{Til})$ of the alignment mark under application of said initial values;

$$\begin{pmatrix} X_{Til} \\ Y_{Til} \end{pmatrix} = \begin{pmatrix} 1+S_x & \alpha & \theta \\ -\theta & 1+S_y & \end{pmatrix} \begin{pmatrix} X_{L1} \\ Y_{L1} \end{pmatrix} + \begin{pmatrix} dx \\ dy \end{pmatrix} \quad \text{Equation (3)}$$

(d) calculating $$\Delta X_{il} = X_{Mi} - X_{Til}$$

$$\Delta Y_{il} = Y_{Mi} - Y_{Til}$$

and determining the residuals $E_{Xil}$, $E_{Yil}$ in each of the alignment marks in accordance with the following rule on the basis of each of the set alignment displacement tolerance values $tol_X$, $tol_Y$ in the directions X and Y which are alignment displacement values allowable in design of the device (A) In the case that $|\Delta X_{il}| \leq tol_X$ and $|\Delta Y_{il}| \leq tol_Y$ $$E_{Xil}=0$$

$$E_{Yil}=0$$

(B) In the case that $|\Delta X_{il}| > tol_X$ and $|\Delta Y_{il}| > tol_Y$:

$$E_{Xil}=|\Delta X_{il}|-tol_X$$

$$E_{Yil}=|\Delta Y_{il}|-tol_Y$$

(C) In the case that $|\Delta X_{il}| \leq tol_X$ and $|\Delta Y_{il}| > tol_Y$:

$$E_{Xil}=0$$

$$E_{Yil}=|\Delta Y_{il}|-tol_Y$$

(D) In the case that $|\Delta X_{il}| > tol_X$ and $|\Delta Y_{il}| \leq tol_Y$:

$$E_{Xil}=|\Delta X_{il}|-tol_X$$

$$E_{Yil}=0$$

(e) calculating a residual sum of squares $R_1$ in reference to the following equation (4) on the basis of these residuals $E_{Xil}$ and $E_{Yil}$ $$R_1 = \sum_{i=0}^{N-1} E_{Xil}^2 + \sum_{i=0}^{N-1} E_{Yil}^2 \quad \text{Equation (4)}$$

(f) calculating the correction coordinate with said residual sum of squares being within a reference value.

8. An alignment method according to claim 7 in which a reference value of said residual sum of squares is either a minimum value or a local minimum value.

9. An alignment method according to claim 7 in which said residuals are calculated in reference to a shape of the actual lower layer pattern.

10. An alignment method according to claim 9 in which residuals are calculated with said lower layer pattern being of a substantial circular shape.

11. An alignment method for determining a position where a second pattern in respect to a first pattern is to be formed on the basis of measurement of positions of alignment marks of the number of N associated with the first pattern formed on a substrate comprising the steps of:

(a) measuring the positions of the alignment marks of the number of N associated with the first pattern and calculating the coordinates $(X_{Mi}, Y_{Mi})$ (where, i=0, 1, 2, ... N−1) of each of the alignment marks in reference to a result of such measurement;

(b) under an assumption that offsets of errors in the directions X and Y of the alignment marks are defined as dx, dy, a rotation angle of an error in a rotating direction of the alignment marks is defined as θ, an orthogonal degree of layout which is an error of orthogonal degree of layout in each of the alignment marks is defined as α, and scalings which are variation in magnification of the alignment marks in their directions X and Y are defined as $S_X$, $S_Y$, calculating initial values dx, dy, θ, α, $S_X$, $S_Y$ for getting the alignment correction coefficients by a method of least squares in reference to the following equation (1) and the equation (2) on the basis of the coordinates $(X_{Mi}, Y_{Mi})$ of each of the alignment marks and the coordinates $(X_{Li}, Y_{Li})$ of the rational grid point corresponding to each of the alignment marks, $$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (1)}$$

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (2)}$$

$a = 1 + S_X$
$b = \alpha + \theta$
$c = dx$
$d = -\theta$
$e = 1 + S_Y$
$f = dy$ (c) calculating the corrected coordinates $(X_{Ti}, Y_{Ti})$ of the alignment mark under application of said initial values;

$$\begin{pmatrix} X_{Ti} \\ Y_{Ti} \end{pmatrix} = \begin{pmatrix} 1+S_x & \alpha+\theta \\ -\theta & 1+S_y \end{pmatrix} \begin{pmatrix} X_{Li} \\ Y_{Li} \end{pmatrix} + \begin{pmatrix} dx \\ dy \end{pmatrix} \quad \text{Equation (3)}$$

(d) calculating $\Delta X_{ii} = X_{Mi} - X_{Ti}$ $\Delta Y_{ii} = Y_{Mi} - Y_{Ti}$ and determining the residuals $E_{Xii}$, $E_{Yii}$ in each of the alignment marks in accordance with the following rule on the basis of each of the set alignment displacement tolerance values $tol_X$, $tol_Y$ in the directions X and Y which are alignment displacement values allowable in design of the device (A) In the case that $|\Delta X_{ii}| \leq tol_X$ and $|\Delta Y_{ii}| \leq tol_Y$ $E_{Xii} = 0$ $E_{Yii} = 0$ (B) In the case that $|\Delta X_{ii}| > tol_X$ and $|\Delta Y_{ii}| > tol_Y$:

$E_{Xii} = |\Delta X_{ii}| - tol_X$ $E_{Yii} = |\Delta Y_{ii}| - tol_Y$ (C) In the case that $|\Delta X_{ii}| \leq tol_X$ and $|\Delta Y_{ii}| > tol_Y$:

$E_{Xii} = 0$ $E_{Yii} = |\Delta Y_{ii}| - tol_Y$ (D) In the case that $|\Delta X_{ii}| > tol_X$ and $|\Delta Y_{ii}| \leq tol_Y$:

$E_{Xii} = |\Delta X_{ii}| - tol_X$ $E_{Yii} = 0$ calculating a residual sum of squares $R_1$ in reference to the following equation (4) on the basis of these residuals $E_{Xii}$ and $E_{yii}$ $$R_1 = \sum_{i=0}^{N-1} E_{Xii}^2 + \sum_{i=0}^{N-1} E_{Yii}^2 \quad \text{Equation (4)}$$

(e) repeating the step (c) for a plurality of times with the alignment correction coefficients dx, dy, θ, α, $S_X$, $S_Y$ added by random number elements Δdx, Δdy, Δθ, Δα, Δ$S_X$, Δ$S_Y$ being applied as new alignment correction coefficients dx, dy, θ, α, $S_X$, $S_Y$; and (f) calculating the corrected coordinates $(X_{TiF}, Y_{TiF})$ of each of the alignment marks associated with the first pattern for optically exposing the second pattern with the following equation (5) in reference to the alignment correction coefficients dx, dy, θ, α, $S_X$, $S_Y$ and each of the random number elements Δdx, Δdy, Δθ, Δα, Δ$S_X$, $S_Y$ when the minimum residual sum $R_1$ of squares is attained $$\begin{pmatrix} X_{TiF} \\ Y_{TiF} \end{pmatrix} = \begin{pmatrix} 1+S_x+\Delta S_x & \alpha+\Delta\alpha+\theta+\Delta\theta \\ -(\theta+\Delta\theta) & 1+S_y+\Delta S_y \end{pmatrix} \begin{pmatrix} X_{Li} \\ Y_{Li} \end{pmatrix} + \begin{pmatrix} dx+\Delta dx \\ dy+\Delta dy \end{pmatrix} \quad \text{Equation (5)}$$

12. An alignment method according to claim 11, wherein the residuals $E_{Xii}$ and $E_{Yii}$ in each of the alignment marks in said step (d) are changed and determined in accordance with the following rule (A') In the case that $\Delta X_{ii}^2 + \Delta Y_{ii}^2 \leq tol_X^2 + tol_Y^2$ $E_{Xii} = 0$ $E_{Yii} = 0$ (B') In the case that $\Delta X_{ii}^2 + \Delta Y_{ii}^2 > tol_X^2 + tol_Y^2$ $E_{Xii}^2 + E_{Yii}^2 = \Delta X_{ii}^2 + \Delta Y_{ii}^2 - (tol_X^2 + tol_Y^2)$ 13. An alignment method for determining a position where a third pattern in respect to a first pattern and a second pattern is to be formed on the basis of measurement of positions of alignment marks of the number of N associated with the first pattern formed on a substrate comprising the steps of:

(a) measuring the positions of the alignment marks of the number of N associated with the first pattern and calculating the coordinates of each of the alignment marks in reference to a result of such measurement;

(b) measuring positions of the alignment marks of the number of N associated with the second pattern and calculating the coordinates of each of the alignment marks in reference to a result of such measurement;

(c) calculating an alignment displacement amount in each of the alignment marks;

(d) calculating an initial value for getting an alignment correction coefficient under application of a method of least squares in reference to errors in the directions X and Y of the alignment marks associated with the first pattern, errors in rotational directions of the alignment marks associated with the first pattern, errors of an orthogonal degree of alignment marks associated with the first pattern, errors of magnification in the directions X and Y of the alignment marks associated with the first pattern, the coordinates of each of the alignment marks associated with the first pattern, and the coordinates of the rational grid corresponding to each of said alignment marks;

(e) calculating the corrected coordinates under application of said correction coefficients;

(f) calculating a difference between said corrected coordinates and said alignment mark coordinates;

(g) calculating the second alignment tolerance values in the directions X and Y in reference to the first alignment displacement tolerance value and the alignment displacement amount in each of the directions X and Y calculated at said step (f);

(h) setting the residual of each of the alignment marks associated with said first pattern 0 when it is within said second tolerance value and making a sum of squares and making a sum of squares of residuals other than said second tolerance value on the basis of the second tolerance value calculated at said step (f); and (i) calculating the alignment correction coordinates in which said value of sum of squares is within a reference value.

14. An alignment method according to claim 13 in which a reference value of said sum of squares is either a minimum value or a local minimum value.

15. An alignment method according to claim 13 in which each of the alignment mark residuals associated with said first pattern of said step (h) is calculated in response to a shape of the actual lower layer pattern.

16. An alignment method according to claim 15 in which a residual is calculated with a shape of said actual lower layer pattern being of a substantial circular shape.

17. An alignment method for determining a position where a third pattern in respect to a first pattern and a second pattern is to be formed on the basis of measurement of positions of alignment marks of the number of N associated with the first pattern formed on a substrate comprising the steps of:

(a) measuring the positions of the alignment marks of the number of N associated with the first pattern and calculating the coordinates $(X_{Mi}, Y_{Mi})$ (where, i=0, 1, 2, ..., N−1. Subsequent is also similar) of each of the alignment marks in reference to a result of such measurement;

(b) measuring positions of the alignment marks of the number of N associated with the second pattern and getting the coordinates $(X_{Mi2}, Y_{Mi2})$ of each of the alignment marks in reference to a result of such measurement;

(c) calculating alignment displacement amounts $\Delta e_{xi}, \Delta e_{yi}$ at each of the alignment marks in reference to the following equations (6-1) and (6-2)

$$\Delta e_{xi} = X_{Mi2} - X_{Mi} \qquad \text{Equation (6-1)}$$

$$e_{yi} = Y_{Mi2} - Y_{Mi} \qquad \text{Equation (6-2)}$$

(d) under an assumption that offsets of errors in the directions X and Y of the alignment marks associated with the first pattern are defined as dx, dy, a rotation angle of an error in a rotating direction of the alignment marks associated with the first pattern is defined as θ, an orthogonal degree of layout which is an error of orthogonal degree of layout in each of the alignment marks associated with the first pattern is defined as α, and scalings which are variation in magnification of the alignment marks in their directions X and Y associated with the first pattern are defined as $S_X, S_Y$, calculating the alignment correction coefficients dx, dy, θ, α, $S_X$, $S_Y$ by a method of least squares in reference to the following equation (1) and the equation (2) on the basis of the coordinates $(X_{Mi}, Y_{Mi})$ of each of the alignment marks and the coordinates $(X_{Li}, Y_{Li})$ of the rational grid point corresponding to each of said alignment marks, $$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} a \\ b \\ c \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (1)}$$

$$\begin{pmatrix} \sum_{i=0}^{N-1} X_{Li}^2 & \sum_{i=0}^{N-1} X_{Li}Y_{Li} & \sum_{i=0}^{N-1} X_{Li} \\ \sum_{i=0}^{N-1} X_{Li}Y_{Li} & \sum_{i=0}^{N-1} Y_{Li}^2 & \sum_{i=0}^{N-1} Y_{Li} \\ \sum_{i=0}^{N-1} X_{Li} & \sum_{i=0}^{N-1} Y_{Li} & \sum_{i=0}^{N-1} i \end{pmatrix} \begin{pmatrix} d \\ e \\ f \end{pmatrix} = \begin{pmatrix} \sum_{i=0}^{N-1} X_{Mi}X_{Li} \\ \sum_{i=0}^{N-1} X_{Mi}Y_{Li} \\ \sum_{i=0}^{N-1} X_{Mi} \end{pmatrix} \quad \text{Equation (2)}$$

where $a = 1 + S_X$
$b = \alpha + \theta$
$c = dx$
$d = -\theta$
$e = 1 + S_Y$
$f = dy$ (e) calculating the corrected coordinates $(X_{Ti}, Y_{Ti})$ of the alignment mark under application of the following equation (3) in reference to the alignment correction coefficients dx, dy, θ, α, $S_X$, $S_Y$ $$\begin{pmatrix} X_{Ti1} \\ Y_{Ti1} \end{pmatrix} = \begin{pmatrix} 1+S_x & \alpha & \theta \\ -\theta & 1+S_y & \end{pmatrix} \begin{pmatrix} X_{L1} \\ Y_{L1} \end{pmatrix} + \begin{pmatrix} dx \\ dy \end{pmatrix} \quad \text{Equation (3)}$$

then, calculating $$\Delta X_{ii} = X_{Mi} - X_{Ti}$$

$$\Delta Y_{ii} = Y_{Mi} - T_{Ti}$$

then, determining alignment displacement tolerance values $tol_X$ and $tol_Y$ in the directions X and Y which are alignment displacement values allowable in design of the device, alignment displacement amounts $\Delta e_{Xi}$, $\Delta e_{Yi}$ calculated at said step (f), new alignment displacement tolerances $tol_X'$ and $tol_Y'$ in the directions X and Y on the basis of said $\Delta X_{il}$, $\Delta Y_{il}$ in accordance with the following rule;

in the case that (x-1) $\Delta e_{Xi} \geq 0$ and $\Delta X_{i0} \geq 0$:
$tol_X' = tol_X$
in the case that (x-2) $\Delta e_{Xi} \geq 0$ and $\Delta X_{i0} < 0$:
$tol_X' = tol_X - |\Delta e_{Xi}|$ in the case that (x-3) $\Delta e_{Xi} < 0$ and $\Delta X_{i0} \geq 0$:
$tol_X' = tol_X - |\Delta e_{Xi}|$ in the case that (x-4) $\Delta e_{Xi} < 0$ and $\Delta X_{i0} < 0$:
$tol_X' = tol_X$ in the case that (y-1) $\Delta e_{Yi} \geq 0$ and $\Delta Y_{i0} \geq 0$:
$tol_Y' = tol_Y$ in the case that (y-2) $\Delta e_{Yi} \geq 0$ and $\Delta Y_{i0} < 0$:
$tol_Y' = tol_Y - |\Delta e_{Yi}|$ in the case that (y-3) $\Delta e_{Yi} < 0$ and $\Delta Y_{i0} \geq 0$:
$tol_Y' = tol_Y - |\Delta e_{Yi}|$ in the case that (y-4) $\Delta e_{Yi} < 0$ and $\Delta Y_{i0} < 0$:
$tol_Y' = tol_Y$
and determining the residuals $E_{Xil}$, $E_{Yil}$ in each of the alignment marks associated with the first pattern on the basis of each of the $tol_X'$, $tol_Y'$ in accordance with the following rule, (A) in the case that $|\Delta X_{il}| \leq tol_X'$ and $|\Delta Y_{il}| \leq tol_Y'$ $E_{Xil} = 0$ $E_{Yil} = 0$ (B) in the case that $|\Delta X_{il}| > tol_X'$ and $|\Delta Y_{il}| > tol_Y'$:

$E_{Xil} = |\Delta X_{il}| - tol_X'$ $E_{Yil} = |\Delta Y_{il}| - tol_Y'$ (C) in the case that $|\Delta X_{il}| \leq tol_X'$ and $|\Delta Y_{il}| > tol_Y'$:

$E_{Xil} = 0$ $E_{Yil} = |\Delta Y_{il}| - tol_Y'$ (D) In the case that $|\Delta X_{il}| > tol_X'$ and $|\Delta Y_{il}| \leq tol_Y'$:

$E_{Xil} = |\Delta X_{il}| - tol_X'$ $E_{Yil} = 0$ then calculating a residual sum of squares $R_1$ in reference to the following equation (4) on the basis of these residuals $E_{Xil}$ and $E_{Yil}$ $$R_1 = \sum_{i=0}^{N-1} E_{Xil}^2 + \sum_{i=0}^{N-1} E_{Yil}^2 \qquad \text{Equation (4)}$$

(g) repeating the step (e) for a plurality of times with the alignment correction coefficients dx, dy, $\theta$, $\alpha$, $S_X$, $S_Y$ added with the elements $\Delta dx$, $\Delta dy$, $\Delta\theta$, $\Delta\alpha$, $\Delta S_X$, $\Delta S_Y$ being applied as new alignment correction coefficients dx, dy, $\theta$, $\alpha$, $S_X$, $S_Y$; and (h) calculating the corrected coordinates $(X_{TiF}, Y_{TiF})$ of the alignment mark associated with the first pattern for optically exposing the third pattern in accordance with the following equation (5) on the basis of the alignment correction coefficients dx, dy, $\theta$, $\alpha$, $S_X$, $S_Y$ and each of the elements $\Delta dx$, $\Delta dy$, $\Delta\theta$, $\Delta\alpha$, $\Delta S_X$, $\Delta S_Y$ when the minimum residual sum of squares $R_1$ is obtained, $$\begin{pmatrix} X_{TiF} \\ Y_{TiF} \end{pmatrix} = \begin{pmatrix} 1 + S_x + \Delta S_x & \alpha + \Delta\alpha + \theta + \Delta\theta \\ -(\theta + \Delta\theta) & 1 + S_y + \Delta S_y \end{pmatrix} \begin{pmatrix} X_{Li} \\ Y_{Li} \end{pmatrix} + \begin{pmatrix} dx + \Delta dx \\ dy + \Delta dy \end{pmatrix} \qquad \text{Equation (5)}$$

* * * * *